United States Patent
Zhang et al.

(10) Patent No.: US 11,335,735 B2
(45) Date of Patent: May 17, 2022

(54) STRETCHABLE DISPLAY APPARATUS AND IMAGE DISPLAY DRIVING METHOD

(71) Applicants: Chengdu BOE Optoelectronics Technology Co., Ltd., Sichuan (CN); BOE Technology Group Co., Ltd., Beijing (CN)

(72) Inventors: Zhenhua Zhang, Beijing (CN); Yangpeng Wang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 196 days.

(21) Appl. No.: 16/769,392

(22) PCT Filed: May 10, 2019

(86) PCT No.: PCT/CN2019/086477
§ 371 (c)(1),
(2) Date: Jun. 3, 2020

(87) PCT Pub. No.: WO2020/227867
PCT Pub. Date: Nov. 19, 2020

(65) Prior Publication Data
US 2021/0408159 A1    Dec. 30, 2021

(51) Int. Cl.
*H01L 27/32*  (2006.01)
*G09G 3/00*  (2006.01)
(Continued)

(52) U.S. Cl.
CPC ......... *H01L 27/3218* (2013.01); *G09G 3/035* (2020.08); *G09G 3/2003* (2013.01);
(Continued)

(58) Field of Classification Search
CPC . H01L 27/3218; H01L 51/52; H01L 27/3244; H01L 2251/5338; H01L 27/3276;
(Continued)

(56) References Cited

U.S. PATENT DOCUMENTS 9,306,180 B2   4/2016  Kim
9,619,059 B2   4/2017  Park et al.
(Continued)

FOREIGN PATENT DOCUMENTS

CN   105895662 A   8/2016
CN   106876427 A   6/2017
(Continued)

OTHER PUBLICATIONS

International Search Report & Written Opinion dated Jan. 23, 2020, regarding PCT/CN2019/086477.

*Primary Examiner* — Richard J Hong
(74) *Attorney, Agent, or Firm* — Intellectual Valley Law, P.C.

(57) ABSTRACT

A stretchable display apparatus having a substantially non-stretched state and a stretched state is provided. The stretchable display apparatus includes a first stretchable display panel including a plurality of first active subpixels of a first color and a plurality of first standby subpixels of the first color, a second stretchable display panel including a plurality of second active subpixels of the second color and a plurality of second standby subpixels of the second color, and a third stretchable display panel including a plurality of third active subpixels of the third color and a plurality of third standby subpixels of the third color. In the substantially non-stretched state, the plurality of first standby subpixels of the first color, the plurality of second standby subpixels of (Continued)

the second color, and the plurality of third standby subpixels of the third color are configured to be in a standby state and not emit light.

20 Claims, 16 Drawing Sheets

(51) Int. Cl.
*G09G 3/20* (2006.01)
*H01L 51/52* (2006.01)

(52) U.S. Cl.
CPC ..... *H01L 51/52* (2013.01); *G09G 2300/0443* (2013.01); *G09G 2320/0666* (2013.01); *H01L 27/3244* (2013.01); *H01L 2251/5338* (2013.01)

(58) Field of Classification Search
CPC ... H01L 27/326; H01L 51/5209; H01L 51/56; G09G 3/035; G09G 3/2003; G09G 2300/0443; G09G 2320/0666; G06F 3/147; G06F 1/1624; G06F 3/0412; G02F 1/13336

See application file for complete search history.

(56) References Cited

U.S. PATENT DOCUMENTS

| | | |
|---|---|---|
| 9,626,891 B2 | 4/2017 | Lee et al. |
| 10,048,920 B1* | 8/2018 | Greenberger ........... G06F 3/147 |
| 2004/0256977 A1* | 12/2004 | Aston ................. G02F 1/13336 |
| | | 313/498 |
| 2009/0009423 A1* | 1/2009 | Huang .................. G06F 1/1624 |
| | | 345/1.1 |
| 2011/0057861 A1* | 3/2011 | Cok ..................... H01L 51/5209 |
| | | 345/1.3 |
| 2014/0307430 A1* | 10/2014 | Lo .......................... H01L 27/326 |
| | | 362/231 |
| 2015/0028316 A1* | 1/2015 | Kojima .................... H01L 51/56 |
| | | 257/40 |
| 2016/0198567 A1* | 7/2016 | Hong ..................... G06F 3/0412 |
| | | 362/418 |
| 2016/0240802 A1 | 8/2016 | Lee |
| 2016/0293571 A1* | 10/2016 | Yoon ....................... H01L 51/52 |
| 2017/0170253 A1 | 6/2017 | Kim et al. |
| 2019/0392786 A1* | 12/2019 | Chida ................. H01L 27/3276 |
| 2021/0193081 A1* | 6/2021 | Chida .................... H01L 27/326 |

FOREIGN PATENT DOCUMENTS

| | | |
|---|---|---|
| CN | 108831316 A | 11/2018 |
| CN | 110268462 A | 9/2019 |
| WO | 2018075292 A1 | 4/2018 |

\* cited by examiner

STRETCHABLE DISPLAY APPARATUS AND IMAGE DISPLAY DRIVING METHOD

CROSS-REFERENCE TO RELATED APPLICATION

This application is a national stage application under 35 U.S.C. § 371 of International Application No. PCT/CN2019/086477, filed May 10, 2019, the contents of which are incorporated by reference in the entirety.

TECHNICAL FIELD

The present invention relates to display technology, more particularly, to a stretchable display apparatus and an image display driving method.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allow their lengths to be increased in one or more dimensions. Stretchable electronic apparatuses may be useful in various applications including in display apparatuses and sensor arrays.

SUMMARY

In one aspect, the present invention provides a stretchable display apparatus having a substantially non-stretched state and a stretched state, comprising a first stretchable display panel comprising a first matrix of a plurality of first subpixels of a first color, the first matrix comprising a first active matrix of a plurality of first active subpixels of the first color and a first standby matrix of a plurality of first standby subpixels of the first color, the first active matrix interleaving with the first standby matrix thereby forming the first matrix; a second stretchable display panel comprising a second matrix of a plurality of second subpixels of a second color, the second matrix comprising a second active matrix of a plurality of second active subpixels of the second color and a second standby matrix of a plurality of second standby subpixels of the second color, the second active matrix interleaving with the second standby matrix thereby forming the second matrix; and a third stretchable display panel comprising a third matrix of a plurality of third subpixels of a third color, the third matrix comprising a third active matrix of a plurality of third active subpixels of the third color and a third standby matrix of a plurality of third standby subpixels of the third color, the third active matrix interleaving with the third standby matrix thereby forming the third matrix; wherein the first stretchable display panel, the second stretchable display panel and the third stretchable display panel are sequentially stacked on top of each other; wherein, in the substantially non-stretched state, the plurality of first active subpixels of the first color, the plurality of second active subpixels of the second color, and the plurality of third active subpixels of the third color are configured to emit light for image display; and the plurality of first standby subpixels of the first color, the plurality of second standby subpixels of the second color, and the plurality of third standby subpixels of the third color are configured to be in a standby state and not emit light.

Optionally, in the stretched state, the plurality of first active subpixels of the first color, the plurality of second active subpixels of the second color, the plurality of third active subpixels of the third color, at least a portion of the plurality of first standby subpixels of the first color, at least a portion of the plurality of second standby subpixels of the second color, and at least a portion of the plurality of third standby subpixels of the third color are configured to emit light for image display.

Optionally, the stretchable display apparatus is substantially stretched in the stretched state; in the stretched state, the plurality of first standby subpixels of the first color, the plurality of second standby subpixels of the second color, and the plurality of third standby subpixels of the third color are all configured to emit light for image display; and an image display resolution in the substantially non-stretched state is substantially the same as an image display resolution in the stretched state.

Optionally, the first standby matrix comprises a plurality of rows of contiguously arranged first standby subpixels of the first color and a plurality of columns of contiguously arranged first standby subpixels of the first color; adjacent first active subpixels of the first color in a row of the first active matrix are spaced apart by a first standby subpixel of the first color of the plurality of first standby subpixels of the first color; adjacent first active subpixels of the first color in a column of the first active matrix are spaced apart by a first standby subpixel of the first color of the plurality of first standby subpixels of the first color; the second standby matrix comprises a plurality of rows of contiguously arranged second standby subpixels of the second color and a plurality of columns of contiguously arranged second standby subpixels of the second color; adjacent second active subpixels of the second color in a row of the second active matrix are spaced apart by a second standby subpixel of the second color of the plurality of second standby subpixels of the second color; adjacent second active subpixels of the second color in a column of the second active matrix are spaced apart by a second standby subpixel of the second color of the plurality of second standby subpixels of the second color; the third standby matrix comprises a plurality of rows of contiguously arranged third standby subpixels of the third color and a plurality of columns of contiguously arranged third standby subpixels of the third color; adjacent third active subpixels of the third color in a row of the third active matrix are spaced apart by a third standby subpixel of the third color of the plurality of third standby subpixels of the third color; and adjacent third active subpixels of the third color in a column of the third active matrix are spaced apart by a third standby subpixel of the third color of the plurality of third standby subpixels of the third color.

Optionally, the first standby matrix comprises a plurality of rows of first standby subpixels of the first color and a plurality of columns of contiguously arranged first standby subpixels of the first color; adjacent first standby subpixels of the first color in a row of the first standby matrix are spaced apart by a first active subpixel of the first color of the plurality of first active subpixels of the first color; the first active matrix comprises a plurality of rows of first active subpixels of the first color and a plurality of columns of contiguously arranged first active subpixels of the first color; adjacent first active subpixels of the first color in a row of the first active matrix are spaced apart by a first standby subpixel of the first color of the plurality of first standby subpixels of the first color; the second standby matrix comprises a plurality of rows of second standby subpixels of the second color and a plurality of columns of contiguously arranged second standby subpixels of the second color; adjacent second standby subpixels of the second color in a row of the second standby matrix are spaced apart by a second active subpixel of the second color of the plurality of second active subpixels of the second color; the second active matrix comprises a plurality of rows of second active subpixels of the second color and a plurality of columns of contiguously arranged second active subpixels of the second color; adjacent second active subpixels of the second color in a row of the second active matrix are spaced apart by a second standby subpixel of the second color of the plurality of second standby subpixels of the second color; the third standby matrix comprises a plurality of rows of third standby subpixels of the third color and a plurality of columns of contiguously arranged third standby subpixels of the third color; adjacent third standby subpixels of the third color in a row of the third standby matrix are spaced apart by a third active subpixel of the third color of the plurality of third active subpixels of the third color; the third active matrix comprises a plurality of rows of third active subpixels of the third color and a plurality of columns of contiguously arranged third active subpixels of the third color; and adjacent third active subpixels of the third color in a row of the third active matrix are spaced apart by a third standby subpixel of the third color of the plurality of third standby subpixels of the third color.

Optionally, a total number of the plurality of first active subpixels of the first color, a total number of the plurality of second active subpixels of the second color, and a total number of the plurality of third active subpixels of the third color are substantially the same; and a total number of the plurality of first standby subpixels of the first color, a total number of the plurality of second standby subpixels of the second color, and a total number of the plurality of third standby subpixels of the third color are substantially the same.

Optionally, the total number of the plurality of first standby subpixels of the first color is approximately three times of the total number of the plurality of first active subpixels of the first color; the total number of the plurality of second standby subpixels of the second color is approximately three times of the total number of the plurality of second active subpixels of the second color; and the total number of the plurality of third standby subpixels of the third color is approximately three times of the total number of the plurality of third active subpixels of the third color.

Optionally, the total number of the plurality of first standby subpixels of the first color is substantially the same as the total number of the plurality of first active subpixels of the first color; the total number of the plurality of second standby subpixels of the second color is substantially the same as the total number of the plurality of second active subpixels of the second color; and the total number of the plurality of third standby subpixels of the third color is substantially the same as the total number of the plurality of third active subpixels of the third color.

Optionally, the second stretchable display panel and the third stretchable display panel are at least partially transparent display panels allowing at least a portion of light emitted from the first stretchable display panel to transmit through; and a light emitting direction of the stretchable display apparatus is substantially along the first stretchable display panel toward the third stretchable display panel.

Optionally, the first stretchable display panel comprises a stretchable base substrate; wherein, in the substantially non-stretched state, orthographic projections of at least a portion of the plurality of first subpixels of the first color on the stretchable base substrate are at least partially overlapping with one or a combination of (1) orthographic projections of the plurality of second subpixels of the second color on the stretchable base substrate, and (2) orthographic projections of the plurality of third subpixels of the third color on the stretchable base substrate.

Optionally, in the substantially non-stretched state, orthographic projections of the plurality of second active subpixels of the second color on the stretchable base substrate are substantially non-overlapping with the orthographic projections of the plurality of third subpixels of the third color on the stretchable base substrate; and in the substantially non-stretched state, orthographic projections of the plurality of first active subpixels of the first color on the stretchable base substrate are substantially non-overlapping with the orthographic projections of the plurality of second subpixels of the second color on the stretchable base substrate and are substantially non-overlapping with the orthographic projections of the plurality of third subpixels of the third color on the stretchable base substrate.

Optionally, in the substantially non-stretched state, orthographic projections of at least a portion of the plurality of second standby subpixels of the second color on the stretchable base substrate are at least partially overlapping with the orthographic projections of the plurality of third subpixels of the third color on the stretchable base substrate; and in the substantially non-stretched state, orthographic projections of at least a portion of the plurality of first standby subpixels of the first color on the stretchable base substrate are at least partially overlapping with one or a combination of (1) the orthographic projections of the plurality of second subpixels of the second color on the stretchable base substrate, and (2) the orthographic projections of the plurality of third subpixels of the third color on the stretchable base substrate.

Optionally, in the substantially non-stretched state, orthographic projections of at least a portion of the plurality of first standby subpixels of the first color on the stretchable base substrate are substantially overlapping with the orthographic projections of the plurality of second active subpixels of the second color on the stretchable base substrate.

Optionally, the first stretchable display panel comprises a stretchable base substrate; wherein, in the substantially non-stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other.

Optionally, the first stretchable display panel comprises a stretchable base substrate; wherein, in the substantially non-stretched state, an orthographic projection of a respective one of the plurality of third active subpixels of the third color on the stretchable base substrate at least partially covers an orthographic projection of a respective one of the plurality of first standby subpixels of the first color on the stretchable base substrate, and at least partially covers an orthographic projection of a respective one of the plurality of second standby subpixels of the second color on the stretchable base substrate.

Optionally, the stretchable display apparatus is substantially stretched in the stretched state; wherein, in the stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other.

Optionally, the stretchable display apparatus further comprises one or more integrated circuits and a controller coupled to the one or more integrated circuits for driving image display of the stretchable display apparatus; wherein the controller is configured to control the plurality of first active subpixels of the first color, the plurality of second active subpixels of the second color, and the plurality of third active subpixels of the third color to emit light for image display in the substantially non-stretched state; and control the plurality of first standby subpixels of the first color, the plurality of second standby subpixels of the second color, and the plurality of third standby subpixels of the third color to be in a standby state and not emit light in the substantially non-stretched state.

Optionally, the controller is configured to control at least a portion of the plurality of first standby subpixels of the first color, at least a portion of the plurality of second standby subpixels of the second color, and at least a portion of the plurality of third standby subpixels of the third color to emit light for image display in the stretched state.

Optionally, the stretchable display apparatus further comprises a deformation sensor configured to detect a degree of the stretchable display apparatus being stretched; wherein the controller is configured to determine a state of the stretchable display apparatus based on the degree of the stretchable display apparatus being stretched.

Optionally, the first color is green, the second color is red, and the third color is blue.

Optionally, the first stretchable display panel, the second stretchable display panel, and the third stretchable display panel constitute a unitary panel wherein the first stretchable display panel, the second stretchable display panel, and the third stretchable display panel are sequentially continuously connected; and the unitary panel is folded so that the first stretchable display panel, the second stretchable display panel, and the third stretchable display panel are sequentially stacked on top of each other.

Optionally, the stretchable display apparatus further comprises a plurality of first spacers between the first stretchable display panel and the second stretchable display panel, and a plurality of second spacers between the second stretchable display panel and the third stretchable display panel.

Optionally, the plurality of first spacers have a height different from a height of the plurality of second spacers.

Optionally, the second stretchable display panel has gap regions for enhancing light transmittance of light emitted from the first stretchable display panel; and the third stretchable display panel has gap regions for enhancing light transmittance of light emitted from the second stretchable display panel and light emitted from the first stretchable display panel.

In another aspect, the present invention provides an image display driving method, comprising providing a stretchable display apparatus having a substantially non-stretched state and a stretched state; and determining a degree of the stretchable display apparatus being stretched thereby determining whether the stretchable display apparatus is in the substantially non-stretched state or in a stretched state; wherein the stretchable display apparatus comprises a first stretchable display panel comprising a first matrix of a plurality of first subpixels of a first color, the first matrix comprising a first active matrix of a plurality of first active subpixels of the first color and a first standby matrix of a plurality of first standby subpixels of the first color, the first active matrix interleaving with the first standby matrix thereby forming the first matrix; a second stretchable display panel comprising a second matrix of a plurality of second subpixels of a second color, the second matrix comprising a second active matrix of a plurality of second active subpixels of the second color and a second standby matrix of a plurality of second standby subpixels of the second color, the second active matrix interleaving with the second standby matrix thereby forming the second matrix; and a third stretchable display panel comprising a third matrix of a plurality of third subpixels of a third color, the third matrix comprising a third active matrix of a plurality of third active subpixels of the third color and a third standby matrix of a plurality of third standby subpixels of the third color, the third active matrix interleaving with the third standby matrix thereby forming the third matrix; wherein the first stretchable display panel, the second stretchable display panel and the third stretchable display panel are sequentially stacked on top of each other; wherein the method further comprises controlling the plurality of first active subpixels of the first color, the plurality of second active subpixels of the second color, and the plurality of third active subpixels of the third color to emit light for image display in the substantially non-stretched state; and controlling the plurality of first standby subpixels of the first color, the plurality of second standby subpixels of the second color, and the plurality of third standby subpixels of the third color to be in a standby state and not emit light in the substantially non-stretched state.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
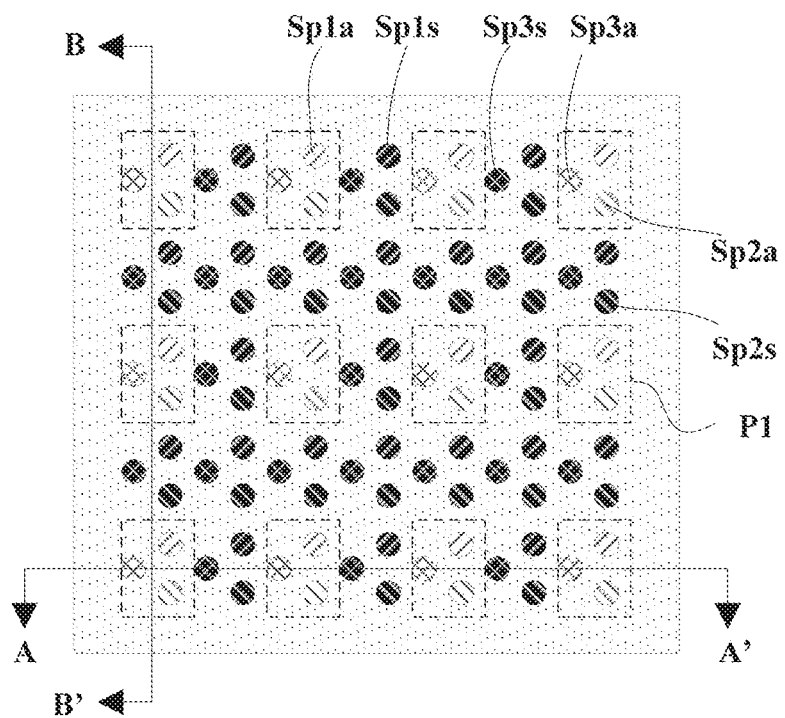
FIG. 1 is a plan view of a stretchable display apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Stretchable display apparatuses have been developed and found various applications in recent years. When stretched, an inter-subpixel distance of the stretchable display apparatus increases, resulting in a decrease in the display resolution.

Accordingly, the present disclosure provides, inter alia, a stretchable display apparatus and an image display driving method that substantially obviate one or more of the problems due to limitations and disadvantages of the related art. In one aspect, the present disclosure provides a stretchable display apparatus having a substantially non-stretched state and a stretched state. In some embodiments, the stretchable display apparatus includes a first stretchable display panel including a first matrix of a plurality of first subpixels of a first color, the first matrix including a first active matrix of a plurality of first active subpixels of the first color and a first standby matrix of a plurality of first standby subpixels of the first color, the first active matrix interleaving with the first standby matrix thereby forming the first matrix; a second stretchable display panel including a second matrix of a plurality of second subpixels of a second color, the second matrix including a second active matrix of a plurality of second active subpixels of the second color and a second standby matrix of a plurality of second standby subpixels of the second color, the second active matrix interleaving with the second standby matrix thereby forming the second matrix; and a third stretchable display panel including a third matrix of a plurality of third subpixels of a third color, the third matrix including a third active matrix of a plurality of third active subpixels of the third color and a third standby matrix of a plurality of third standby subpixels of the third color, the third active matrix interleaving with the third standby matrix thereby forming the third matrix. The first stretchable display panel, the second stretchable display panel and the third stretchable display panel are sequentially stacked on top of each other. Optionally, in the substantially non-stretched state, the plurality of first active subpixels of the first color, the plurality of second active subpixels of the second color, and the plurality of third active subpixels of the third color are configured to emit light for image display; and the plurality of first standby subpixels of the first color, the plurality of second standby subpixels of the second color, and the plurality of third standby subpixels of the third color are configured to be in a standby state and not emit light. Optionally, in the stretched state, the plurality of first active subpixels of the first color, the plurality of second active subpixels of the second color, and the plurality of third active subpixels of the third color, at least a portion of the plurality of first standby subpixels of the first color, at least a portion of the plurality of second standby subpixels of the second color, and at least a portion of the plurality of third standby subpixels of the third color are configured to emit light for image display. Optionally, the stretchable display apparatus is substantially stretched in the stretched state; in the stretched state, the plurality of first standby subpixels of the first color, the plurality of second standby subpixels of the second color, and the plurality of third standby subpixels of the third color are all configured to emit light for image display; and an image display resolution in the substantially non-stretched state is substantially the same as an image display resolution in the stretched state.

Optionally, the first color, the second color, and the third color are different colors selected from green, red, and blue. Optionally, the first color is green, the second color is red, and the third color is blue.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

As used herein, the term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. Optionally, a subpixel refers to an individual light emitting element.

As used herein, the term "substantially non-stretched" refers to a material, structure, device or device component that is elongated less than 1% along any dimension, e.g., not elongated at all. As used herein, the term "stretched" refers to a material, structure, device or device component that is being elongated equal to or more than 1% along any dimension, e.g., more than 5%, more than 10%, or more than 15% along its dimension. As used herein, the term "substantially stretched" refers to a material, structure, device or device component that is elongated to a designed limit or to a maximum degree under its normal operation condition.

As used herein, the term "substantially the same" refers to a difference between two values not exceeding 30% of a base value (e.g., one of the two values), e.g., not exceeding 20%, not exceeding 15%, not exceeding 10%, not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Figure 2:
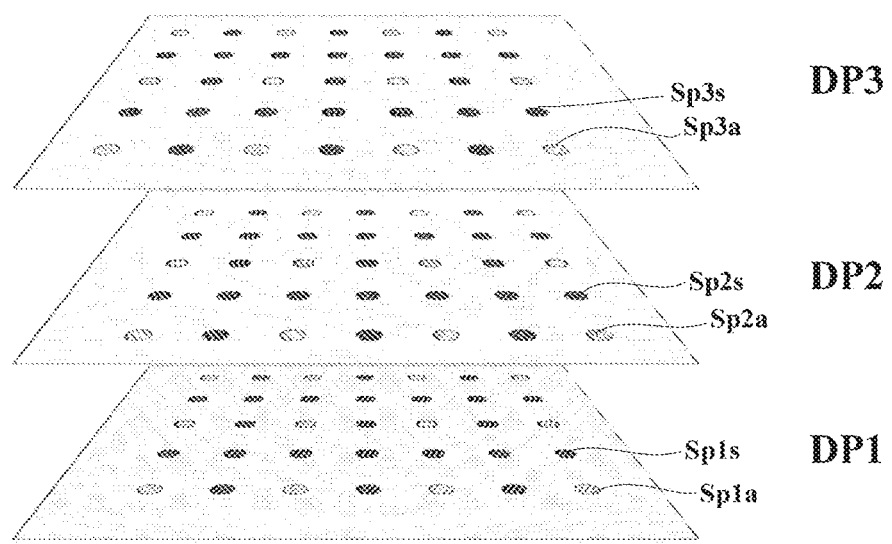
FIG. 2 is a perspective view of a stretchable display apparatus in some embodiments according to the present disclosure.
Figure 3A:
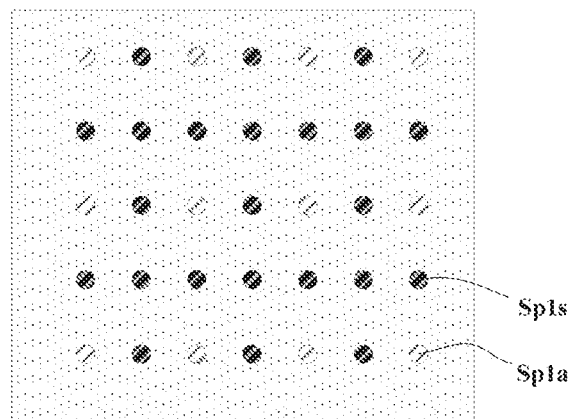
FIGS. 3A to 3C respectively illustrate the structures of a first stretchable display panel, a second stretchable display panel, and a third stretchable display panel of a stretchable display apparatus in some embodiments according to the present disclosure.
Figure 3B:
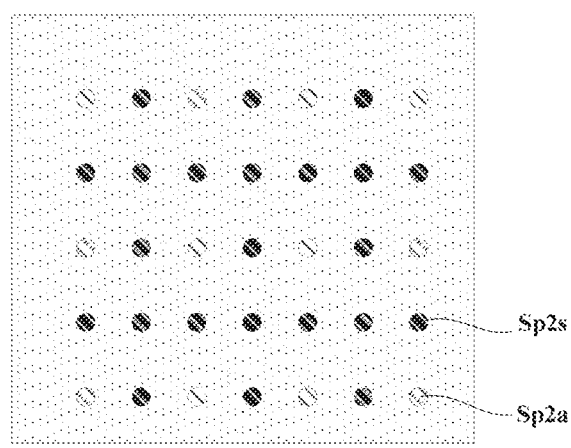
Figure 3C:
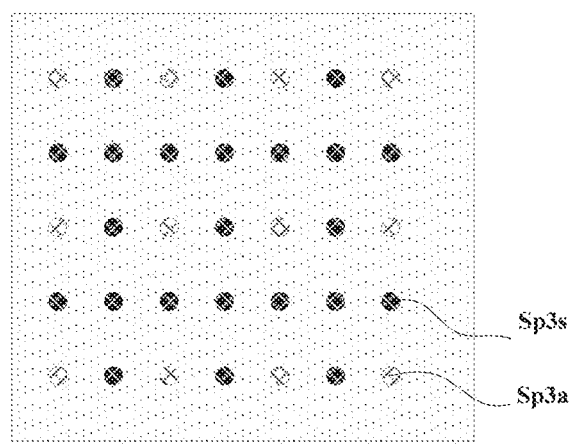

FIG. 1 is a plan view of a stretchable display apparatus in some embodiments according to the present disclosure. FIG. 2 is a perspective view of a stretchable display apparatus in some embodiments according to the present disclosure. FIGS. 3A to 3C respectively illustrate the structures of a first stretchable display panel, a second stretchable display panel, and a third stretchable display panel of a stretchable display apparatus in some embodiments according to the present disclosure. FIGS. 1, 2, and 3A to 3C show the stretchable display apparatus in a substantially non-stretched state. In some embodiments, the stretchable display apparatus includes a first stretchable display panel DP1 including a first matrix of a plurality of first subpixels of a first color, the first matrix including a first active matrix of a plurality of first active subpixels of the first color Sp1$a$ and a first standby matrix of a plurality of first standby subpixels of the first color Sp1$s$; a second stretchable display panel DP2 including a second matrix of a plurality of second subpixels of a second color, the second matrix including a second active matrix of a plurality of second active subpixels Sp2$a$ of the second color and a second standby matrix of a plurality of second standby subpixels of the second color Sp2$s$; and a third stretchable display panel DP3 including a third matrix of a plurality of third subpixels of a third color, the third matrix including a third active matrix of a plurality of third active subpixels of the third color Sp3$a$ and a third standby matrix of a plurality of third standby subpixels of the third color Sp3$s$. The first stretchable display panel DP1, the second stretchable display panel DP2, and the third stretchable display panel DP3 are sequentially stacked on top of each other. Optionally, the first stretchable display panel DP1 is disposed at the bottom of the stretchable display apparatus, the third stretchable display panel DP3 is disposed at the top of the stretchable display apparatus, and the second stretchable display panel DP2 is between the first stretchable display panel DP1 and the third stretchable display panel DP3.

The first active matrix interleaves with the first standby matrix thereby forming the first matrix. The second active matrix interleaves with the second standby matrix thereby forming the second matrix. The third active matrix interleaves with the third standby matrix thereby forming the third matrix.

In some embodiments, in the substantially non-stretched state, the plurality of first active subpixels of the first color Sp1$a$, the plurality of second active subpixels of the second color Sp2$a$, and the plurality of third active subpixels of the third color Sp3$a$ are configured to emit light for image display; and the plurality of first standby subpixels of the first color Sp1$s$, the plurality of second standby subpixels of the second color Sp2$s$, and the plurality of third standby subpixels of the third color Sp3$s$ are configured to be in a standby state and not emit light.

In some embodiments, in the stretched state, the plurality of first active subpixels of the first color Sp1$a$, the plurality of second active subpixels of the second color Sp2$a$, and the plurality of third active subpixels of the third color Sp3$a$, at least a portion of the plurality of first standby subpixels of the first color Sp1$s$, at least a portion of the plurality of second standby subpixels of the second color Sp2$s$, and at least a portion of the plurality of third standby subpixels of the third color Sp3$s$ are configured to emit light for image display.

Figure 4:
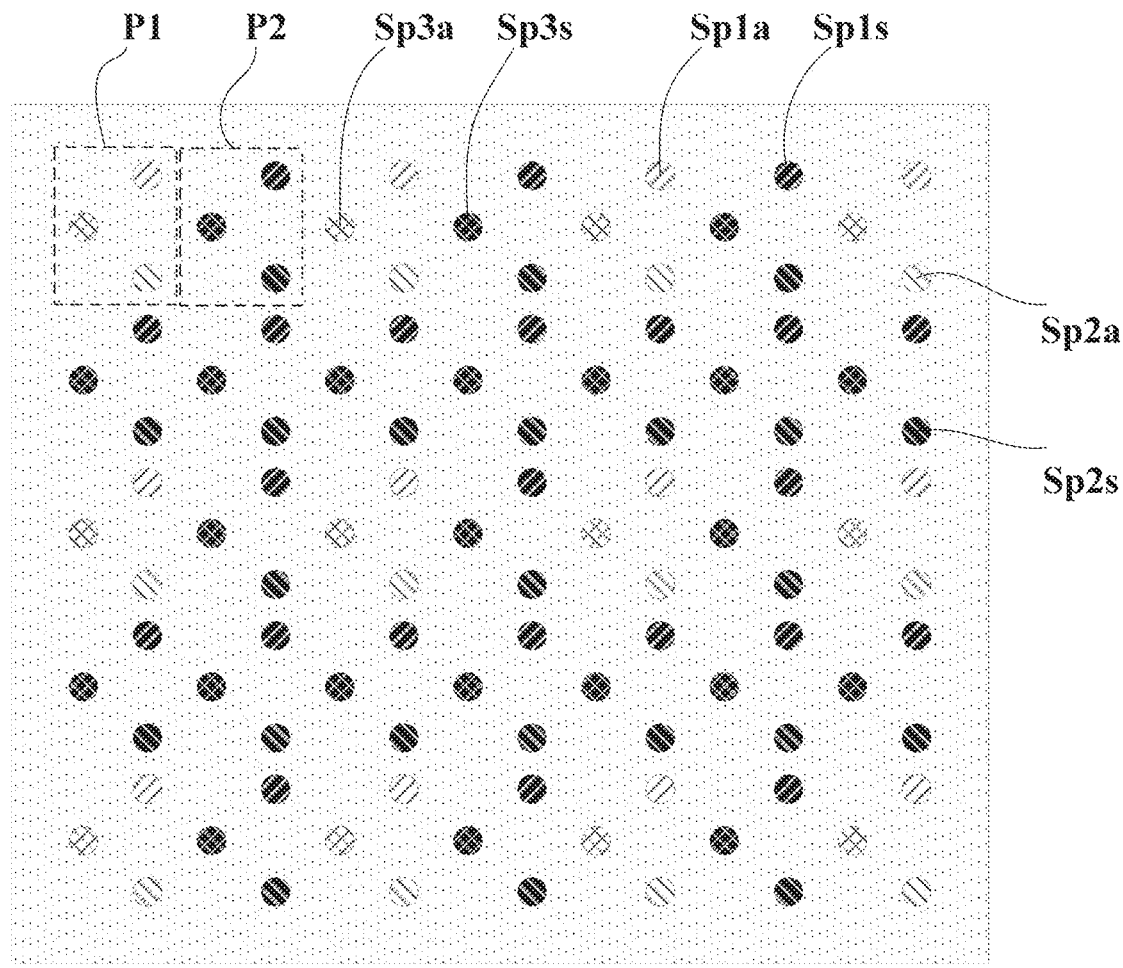
FIG. 4 is a plan view of a stretchable display apparatus in a stretched state in some embodiments according to the present disclosure.

Optionally, the stretchable display apparatus is substantially stretched in the stretched state; in the stretched state, the plurality of first standby subpixels of the first color Sp1$s$, the plurality of second standby subpixels of the second color Sp2$s$, and the plurality of third standby subpixels of the third color Sp3$s$ are all configured to emit light for image display; and an image display resolution in the substantially non-stretched state is substantially the same as an image display resolution in the stretched state. FIG. 4 is a plan view of a stretchable display apparatus in a stretched state in some embodiments according to the present disclosure. Referring to FIG. 1, in the substantially non-stretched state, only the plurality of first active subpixels of the first color Sp1$a$, the plurality of second active subpixels of the second color Sp2$a$, and the plurality of third active subpixels of the third color Sp3$a$ are configured to emit light for image display. A respective one of the plurality of first active subpixels of the first color Sp1$a$, a respective one of the plurality of second active subpixels of the second color Sp2$a$, and a respective one of the plurality of third active subpixels of the third color Sp3$a$ constitute a first pixel P1. Referring to FIG. 4, the stretchable display apparatus is in a fully stretched state, for example, a length of the stretchable display apparatus increases (e.g., doubles) and a width of the stretchable display apparatus increases (e.g., doubles). In the fully stretched state, the plurality of first standby subpixels of the first color Sp1$s$, the plurality of second standby subpixels of the second color Sp2$s$, and the plurality of third standby subpixels of the third color Sp3$s$ are all configured to emit light for image display. A respective one of the plurality of first standby subpixels of the first color Sp1$s$, a respective one of the plurality of second standby subpixels of the second color Sp2s, and a respective one of the plurality of third standby subpixels of the third color Sp3s constitute a second pixel P2. The image display resolution in the substantially non-stretched state is substantially the same as an image display resolution in the stretched state.

Figure 5:
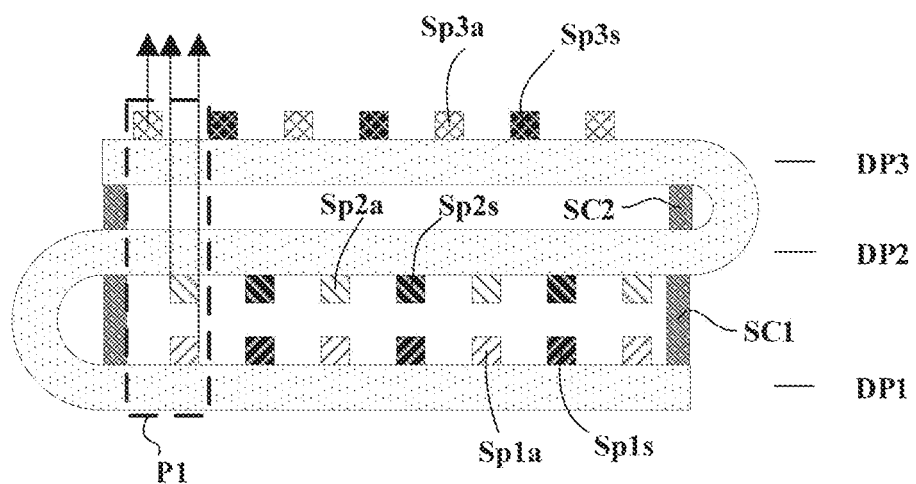
FIG. 5 is a cross-sectional view along an A-A' line of a stretchable display apparatus in FIG. 1 in some embodiments according to the present disclosure.
Figure 6:
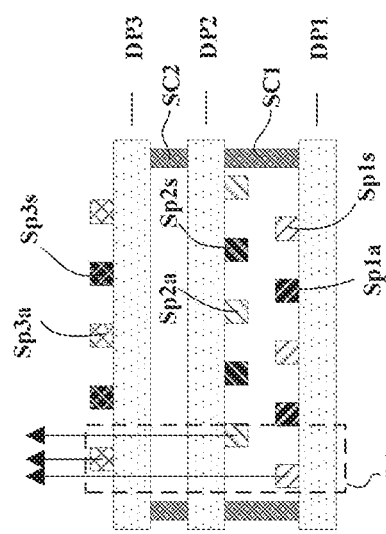
FIG. 6 is a cross-sectional view along a B-B' line of a stretchable display apparatus in FIG. 1 in some embodiments according to the present disclosure.

FIG. 5 is a cross-sectional view along an A-A' line of a stretchable display apparatus in FIG. 1 in some embodiments according to the present disclosure. FIG. 6 is a cross-sectional view along a B-B' line of a stretchable display apparatus in FIG. 1 in some embodiments according to the present disclosure. Referring to FIG. 5 and FIG. 6, in some embodiments, the stacked display panels, including the first stretchable display panel DP1, the second stretchable display panel DP2, and the third stretchable display panel DP3, may be initially formed as an integral panel, e.g., a unitary panel wherein the first stretchable display panel DP1, the second stretchable display panel DP2, and the third stretchable display panel DP3 are sequentially continuously connected. The integral panel may be folded to form the stretchable display apparatus having the first stretchable display panel DP1, the second stretchable display panel DP2, and the third stretchable display panel DP3 stacked on top of each other. For example, the unitary panel is folded so that the first stretchable display panel DP1, the second stretchable display panel DP2, and the third stretchable display panel DP3 are sequentially stacked on top of each other. As shown in FIG. 5 and FIG. 6, the folding of the integral panel in some embodiments includes an in-folding (e.g., between the first stretchable display panel DP1 and the second stretchable display panel DP2) in combination with an out-folding (e.g., between the second stretchable display panel DP2 and the third stretchable display panel DP3). The arrows in FIG. 5 and FIG. 6 indicate light emitting direction.

The stacked stretchable display panels may be spaced apart by spacers. For example, the stretchable display apparatus in some embodiments includes a plurality of first spacers SC1 between the first stretchable display panel DP1 and the second stretchable display panel DP2, and a plurality of second spacers SC2 between the second stretchable display panel DP2 and the third stretchable display panel DP3. Because the plurality of second subpixels of the second color (including the plurality of second active subpixels of the second color Sp2a and the plurality of second standby subpixels of the second color Sp2s) are bottom emitting subpixels, in some embodiments, a respective one of the plurality of first spacers SC1 has a height greater than that of a respective one of the plurality of second spacers SC2. In the stretchable display apparatus as shown in FIG. 5 and FIG. 6, subpixels in the first stretchable display panel DP1 and subpixels in the second stretchable display panel DP2 are facing each other. The plurality of first spacers SC1 have a greater height to allow space for containing the subpixels in the first stretchable display panel DP1 and the subpixels in the second stretchable display panel DP2 between the first stretchable display panel DP1 and the second stretchable display panel DP2. The plurality of second spacers SC2 space apart the second stretchable display panel DP2 and the third stretchable display panel DP3. The space between the second stretchable display panel DP2 and the third stretchable display panel DP3 does not contain any subpixels. Accordingly, the plurality of second spacers SC2 may have a smaller height.

Figure 7:
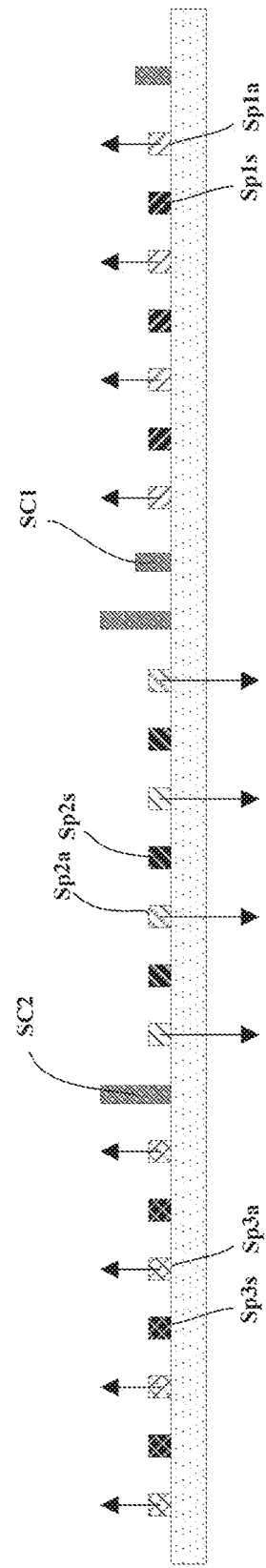
FIG. 7 is a cross-sectional view of a stretchable display apparatus in an unfolded state in some embodiments according to the present disclosure.

FIG. 7 is a cross-sectional view of a stretchable display apparatus in an unfolded state in some embodiments according to the present disclosure. In some embodiments, as shown in FIG. 5, FIG. 6 and FIG. 7, the plurality of second subpixels of the second color (including the plurality of second active subpixels of the second color Sp2a and the plurality of second standby subpixels of the second color Sp2s) are bottom emitting subpixels. Optionally, the plurality of first subpixels of the first color (including the plurality of first active subpixels of the first color Sp1a and the plurality of first standby subpixels of the first color Sp1s) are top emitting subpixels. Optionally, the plurality of third subpixels of the third color (including the plurality of third active subpixels of the third color Sp3a and the plurality of third standby subpixels of the third color Sp3s) are top emitting subpixels.

Figure 8:
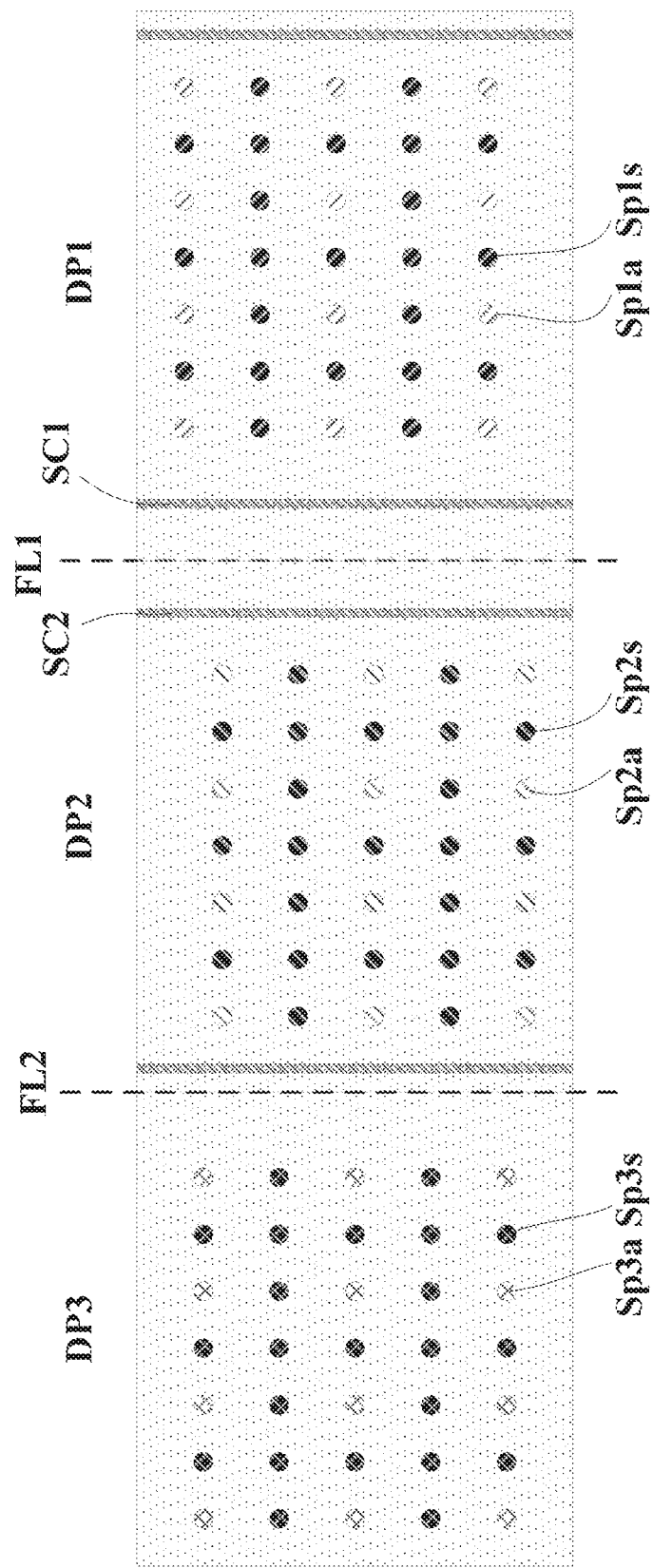
FIG. 8 is a plan view of a stretchable display apparatus in an unfolded state in some embodiments according to the present disclosure.

FIG. 8 is a plan view of a stretchable display apparatus in an unfolded state in some embodiments according to the present disclosure. Referring to FIG. 8, the integral panel (e.g., a unitary panel) may be folded along a first folding line FL1 between the first stretchable display panel DP1 and the second stretchable display panel DP2, and again along a second folding line FL2 between the second stretchable display panel DP2 and the third stretchable display panel DP3.

Figure 9:
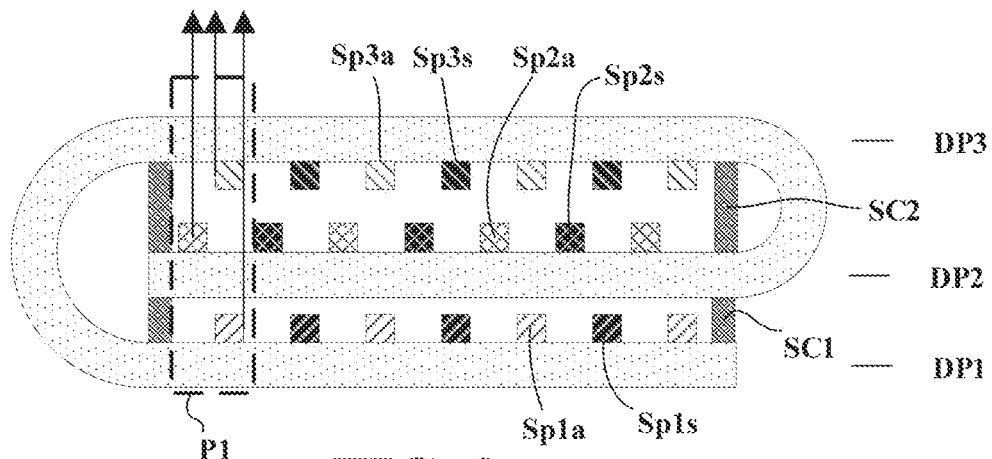
FIG. 9 is a cross-sectional view along an A-A' line of a stretchable display apparatus in FIG. 1 in some embodiments according to the present disclosure.
Figure 10:
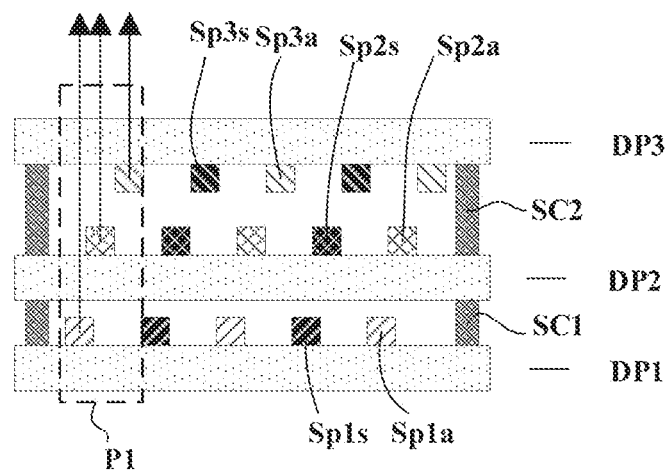
FIG. 10 is a cross-sectional view along a B-B' line of a stretchable display apparatus in FIG. 1 in some embodiments according to the present disclosure.

FIG. 9 is a cross-sectional view along an A-A' line of a stretchable display apparatus in FIG. 1 in some embodiments according to the present disclosure. FIG. 10 is a cross-sectional view along a B-B' line of a stretchable display apparatus in FIG. 1 in some embodiments according to the present disclosure. Referring to FIG. 9 and FIG. 10, in some embodiments, the stacked display panels, including the first stretchable display panel DP1, the second stretchable display panel DP2, and the third stretchable display panel DP3, may be initially formed as an integral panel, e.g., a unitary panel. The integral panel may be folded to form the stretchable display apparatus having the first stretchable display panel DP1, the second stretchable display panel DP2, and the third stretchable display panel DP3 stacked on top of each other. As shown in FIG. 9 and FIG. 10, the folding of the integral panel in some embodiments includes two times of in-folding (e.g., a first in-folding between the first stretchable display panel DP1 the second stretchable display panel DP2 and a second in-folding between the second stretchable display panel DP2 and the third stretchable display panel DP3).

The stacked stretchable display panels may be spaced apart by spacers. For example, the stretchable display apparatus in some embodiments includes a plurality of first spacers SC1 between the first stretchable display panel DP1 and the second stretchable display panel DP2, and a plurality of second spacers SC2 between the second stretchable display panel DP2 and the third stretchable display panel DP3. Because the plurality of third subpixels of the third color (including the plurality of third active subpixels of the third color Sp3a and the plurality of third standby subpixels of the third color Sp3s) are bottom emitting subpixels, in some embodiments, a respective one of the plurality of second spacers SC2 has a height greater than that of a respective one of the plurality of first spacers SC1. In the stretchable display apparatus as shown in FIG. 9 and FIG. 10, subpixels in the second stretchable display panel DP2 and subpixels in the third stretchable display panel DP3 are facing each other. The plurality of second spacers SC2 have a greater height to allow space for containing the subpixels in the second stretchable display panel DP2 and the subpixels in the third stretchable display panel DP3 between the second stretchable display panel DP2 and subpixels in the third stretchable display panel DP3. The plurality of first spacers SC1 space apart the first stretchable display panel DP1 and the second stretchable display panel DP2. The space between the first stretchable display panel DP1 and the second stretchable display panel DP2 only contain subpixels in the first stretchable display panel DP1. Accordingly, the plurality of first spacers SC1 may have a smaller height.

Referring to FIGS. 1 to 10, in some embodiments, the first stretchable display panel DP1 includes a stretchable base substrate (see, e.g., BS1 in FIG. 3A), and in the substantially non-stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other. Optionally, when the stretchable display apparatus is substantially stretched in the stretched state, the orthographic projections of the plurality of first subpixels of the first color on the stretchable base substrate, the orthographic projections of the plurality of second subpixels of the second color on the stretchable base substrate, and the orthographic projections of the plurality of third subpixels of the third color on the stretchable base substrate are substantially non-overlapping with each other. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping.

Figure 11A:
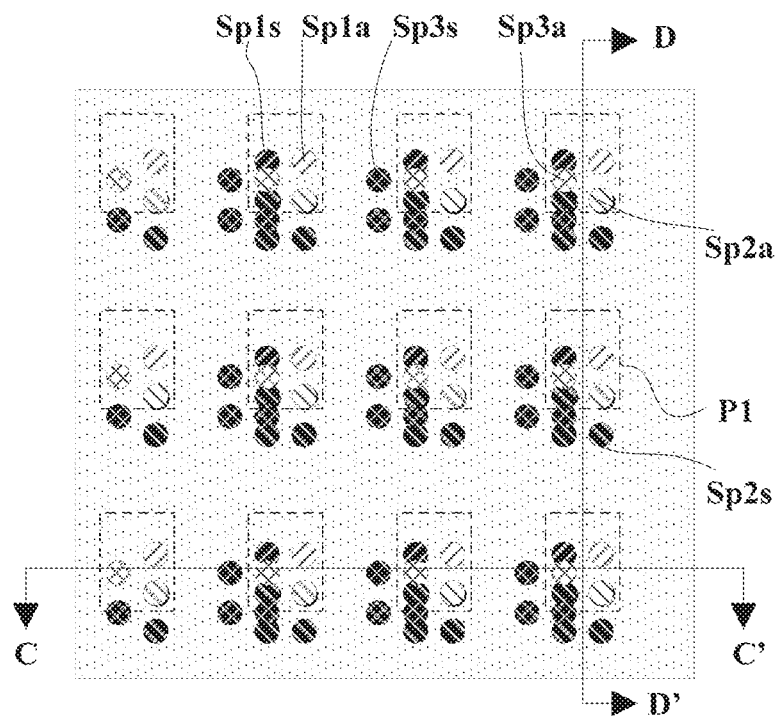
FIG. 11A is a plan view of a stretchable display apparatus in some embodiments according to the present disclosure.
Figure 12:
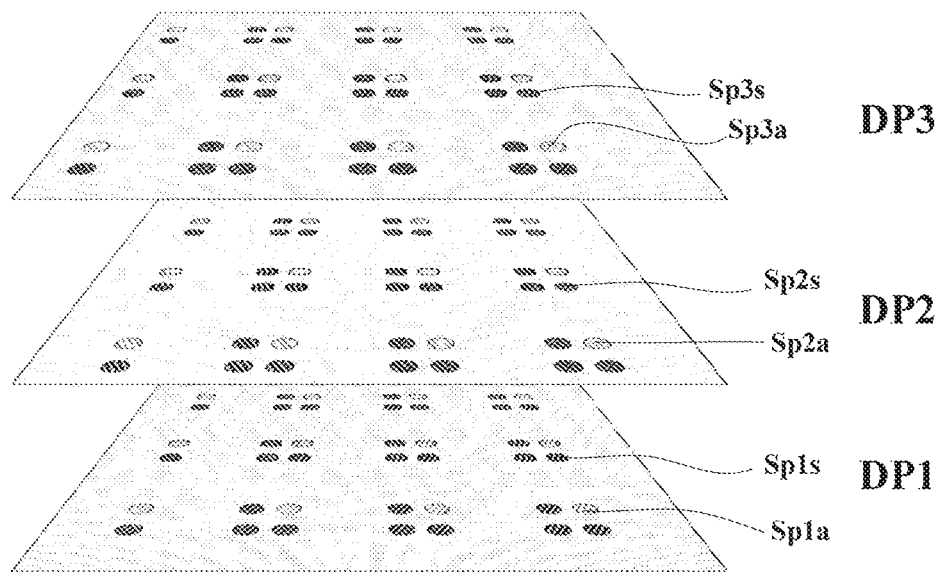
FIG. 12 is a perspective view of a stretchable display apparatus in some embodiments according to the present disclosure.
Figure 13A:
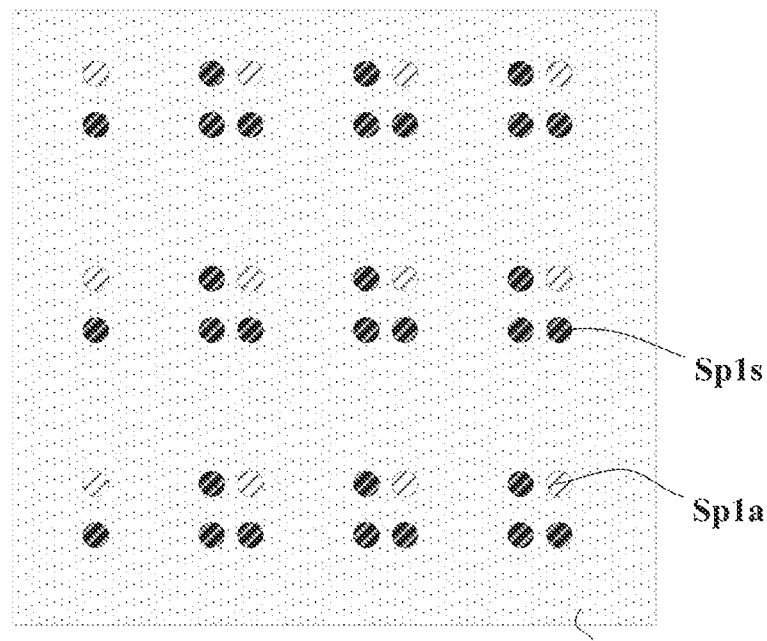
FIGS. 13A to 13C respectively illustrate the structures of a first stretchable display panel, a second stretchable display panel, and a third stretchable display panel of a stretchable display apparatus in some embodiments according to the present disclosure.
Figure 13B:
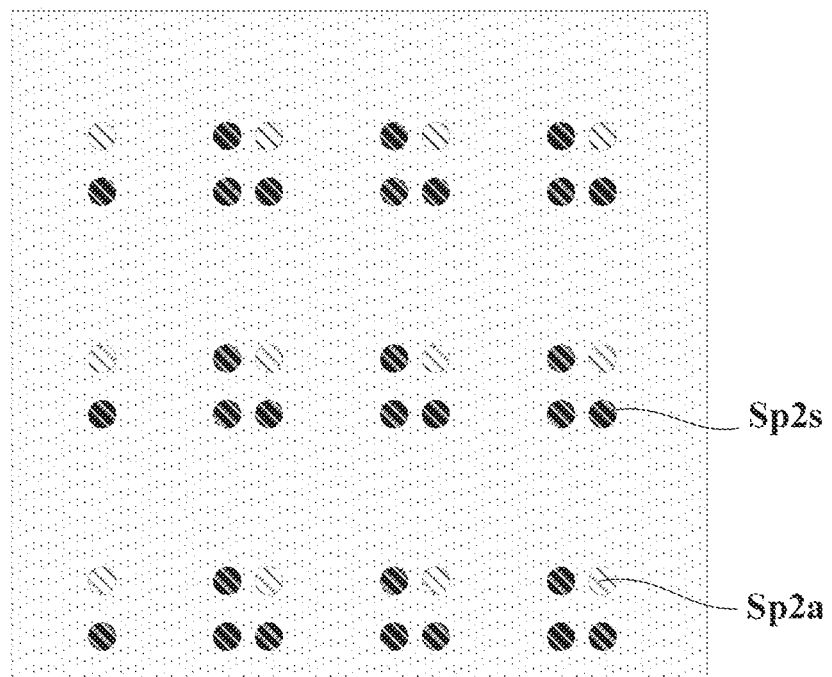
Figure 13C:
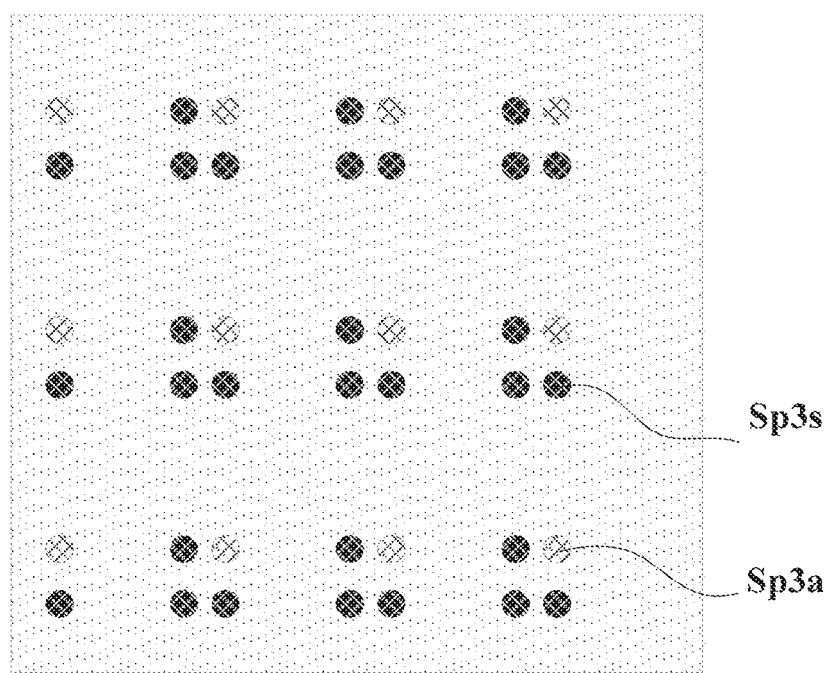

FIG. 11A is a plan view of a stretchable display apparatus in some embodiments according to the present disclosure. FIG. 12 is a perspective view of a stretchable display apparatus in some embodiments according to the present disclosure. FIGS. 13A to 13C respectively illustrate the structures of a first stretchable display panel, a second stretchable display panel, and a third stretchable display panel of a stretchable display apparatus in some embodiments according to the present disclosure. FIGS. 11A, 12, and 13A to 13C show the stretchable display apparatus in a substantially non-stretched state. In some embodiments, the stretchable display apparatus includes a first stretchable display panel DP1 including a first matrix of a plurality of first subpixels of a first color, the first matrix including a first active matrix of a plurality of first active subpixels of the first color Sp1$a$ and a first standby matrix of a plurality of first standby subpixels of the first color Sp1$s$; a second stretchable display panel including a second matrix of a plurality of second subpixels of a second color, the second matrix including a second active matrix of a plurality of second active subpixels of the second color Sp2$a$ and a second standby matrix of a plurality of second standby subpixels of the second color Sp2$s$; and a third stretchable display panel including a third matrix of a plurality of third subpixels of a third color, the third matrix including a third active matrix of a plurality of third active subpixels of the third color Sp3$a$ and a third standby matrix of a plurality of third standby subpixels of the third color Sp3$s$. The first stretchable display panel DP1, the second stretchable display panel DP2, and the third stretchable display panel DP3 are sequentially stacked on top of each other. Optionally, the first stretchable display panel DP1 is disposed at the bottom of the stretchable display apparatus, the third stretchable display panel DP3 is disposed at the top of the stretchable display apparatus, and the second stretchable display panel DP2 is between the first stretchable display panel DP1 and the third stretchable display panel DP3.

The first active matrix interleaves with the first standby matrix thereby forming the first matrix. The second active matrix interleaves with the second standby matrix thereby forming the second matrix. The third active matrix interleaves with the third standby matrix thereby forming the third matrix.

In some embodiments, in the substantially non-stretched state, the plurality of first active subpixels of the first color Sp1$a$, the plurality of second active subpixels of the second color Sp2$a$, and the plurality of third active subpixels of the third color Sp3$a$ are configured to emit light for image display; and the plurality of first standby subpixels of the first color Sp1$s$, the plurality of second standby subpixels of the second color Sp2$s$, and the plurality of third standby subpixels of the third color Sp3$s$ are configured to be in a standby state and not emit light.

In some embodiments, in the stretched state, the plurality of first active subpixels of the first color Sp1$a$, the plurality of second active subpixels of the second color Sp2$a$, the plurality of third active subpixels of the third color Sp3$a$, at least a portion of the plurality of first standby subpixels of the first color Sp1$s$, at least a portion of the plurality of second standby subpixels of the second color Sp2$s$, and at least a portion of the plurality of third standby subpixels of the third color Sp3$s$ are configured to emit light for image display.

In some embodiments, referring to FIGS. 11A, 12, and 13A to 13C, the first standby matrix includes a plurality of rows of contiguously arranged first standby subpixels of the first color and a plurality of columns of contiguously arranged first standby subpixels of the first color; the second standby matrix comprises a plurality of rows of contiguously arranged second standby subpixels of the second color and a plurality of columns of contiguously arranged second standby subpixels of the second color; and the third standby matrix comprises a plurality of rows of contiguously arranged third standby subpixels of the third color and a plurality of columns of contiguously arranged third standby subpixels of the third color. Optionally, adjacent first active subpixels of the first color in a row of the first active matrix are spaced apart by a first standby subpixel of the first color of the plurality of first standby subpixels of the first color. Optionally, adjacent first active subpixels of the first color in a column of the first active matrix are spaced apart by a first standby subpixel of the first color of the plurality of first standby subpixels of the first color. Optionally, adjacent second active subpixels of the second color in a row of the second active matrix are spaced apart by a second standby subpixel of the second color of the plurality of second standby subpixels of the second color. Optionally, adjacent second active subpixels of the second color in a column of the second active matrix are spaced apart by a second standby subpixel of the second color of the plurality of second standby subpixels of the second color. Optionally, adjacent third active subpixels of the third color in a row of the third active matrix are spaced apart by a third standby subpixel of the third color of the plurality of third standby subpixels of the third color. Optionally, adjacent third active subpixels of the third color in a column of the third active matrix are spaced apart by a third standby subpixel of the third color of the plurality of third standby subpixels of the third color.

Referring to FIG. 11A, in some embodiments, in a column of subpixels, an orthographic projection of a respective one of the plurality of first standby subpixels of the first color Sp1$s$ on the stretchable base substrate partially overlaps with an orthographic projection of an adjacent respective one of the plurality of third active subpixels of the third color Sp3$a$ on the stretchable base substrate. In a column of subpixels, an orthographic projection of a respective one of the plurality of third active subpixels of the third color Sp3a on the stretchable base substrate partially overlaps with an orthographic projection of an adjacent respective one of the plurality of first standby subpixels of the first color Sp1s on the stretchable base substrate; and partially overlaps with an orthographic projection of an adjacent respective one of the plurality of second standby subpixels of the second color Sp2s on the stretchable base substrate. In a column of subpixels, an orthographic projection of a first respective one of the plurality of second standby subpixels of the second color Sp2s on the stretchable base substrate at least partially overlaps with an orthographic projection of an adjacent respective one of the plurality of first standby subpixels of the first color Sp1s on the stretchable base substrate; partially overlaps with an orthographic projection of an adjacent respective one of the plurality of third active subpixels of the third color Sp3a on the stretchable base substrate; and partially overlaps with an orthographic projection of an adjacent respective one of the plurality of third standby subpixels of the third color Sp3s on the stretchable base substrate. In a column of subpixels, an orthographic projection of a respective one of the plurality of third standby subpixels of the third color Sp3s on the stretchable base substrate partially overlaps with an orthographic projection of a first adjacent respective one of the plurality of second standby subpixels of the second color Sp2s on the stretchable base substrate; and partially overlaps with an orthographic projection of a second adjacent respective one of the plurality of second standby subpixels of the second color Sp2s on the stretchable base substrate. In a column of subpixels, an orthographic projection of a second respective one of the plurality of second standby subpixels of the second color Sp2s on the stretchable base substrate partially overlaps with an orthographic projection of an adjacent respective one of the plurality of third standby subpixels of the third color Sp3s on the stretchable base substrate.

Figure 11B:
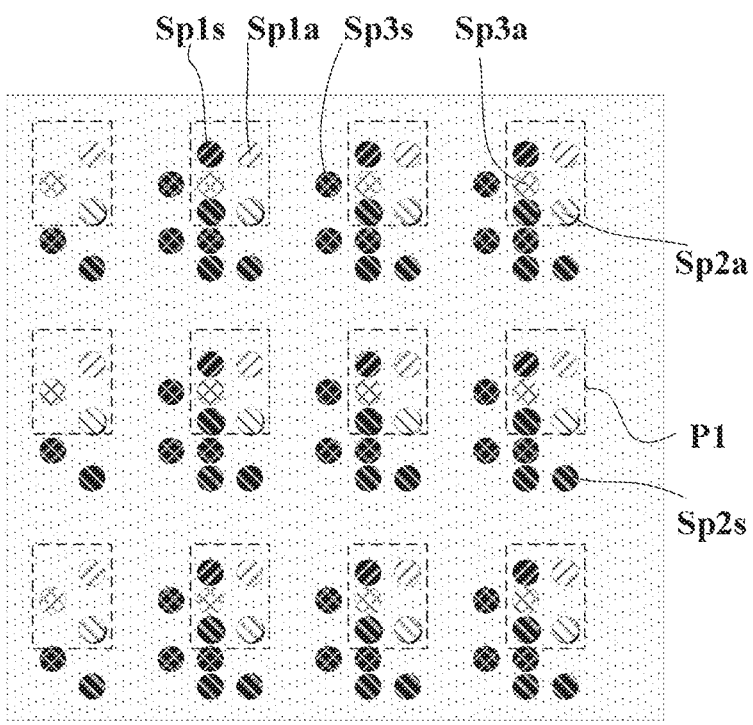
FIG. 11B is a plan view of a stretchable display apparatus in some embodiments according to the present disclosure.

FIG. 11B is a plan view of a stretchable display apparatus in some embodiments according to the present disclosure. In contrast to FIG. 11A, in some embodiments, in a column of subpixels, orthographic projections of subpixels are substantially non-overlapping with respect to each other.

Figure 14:
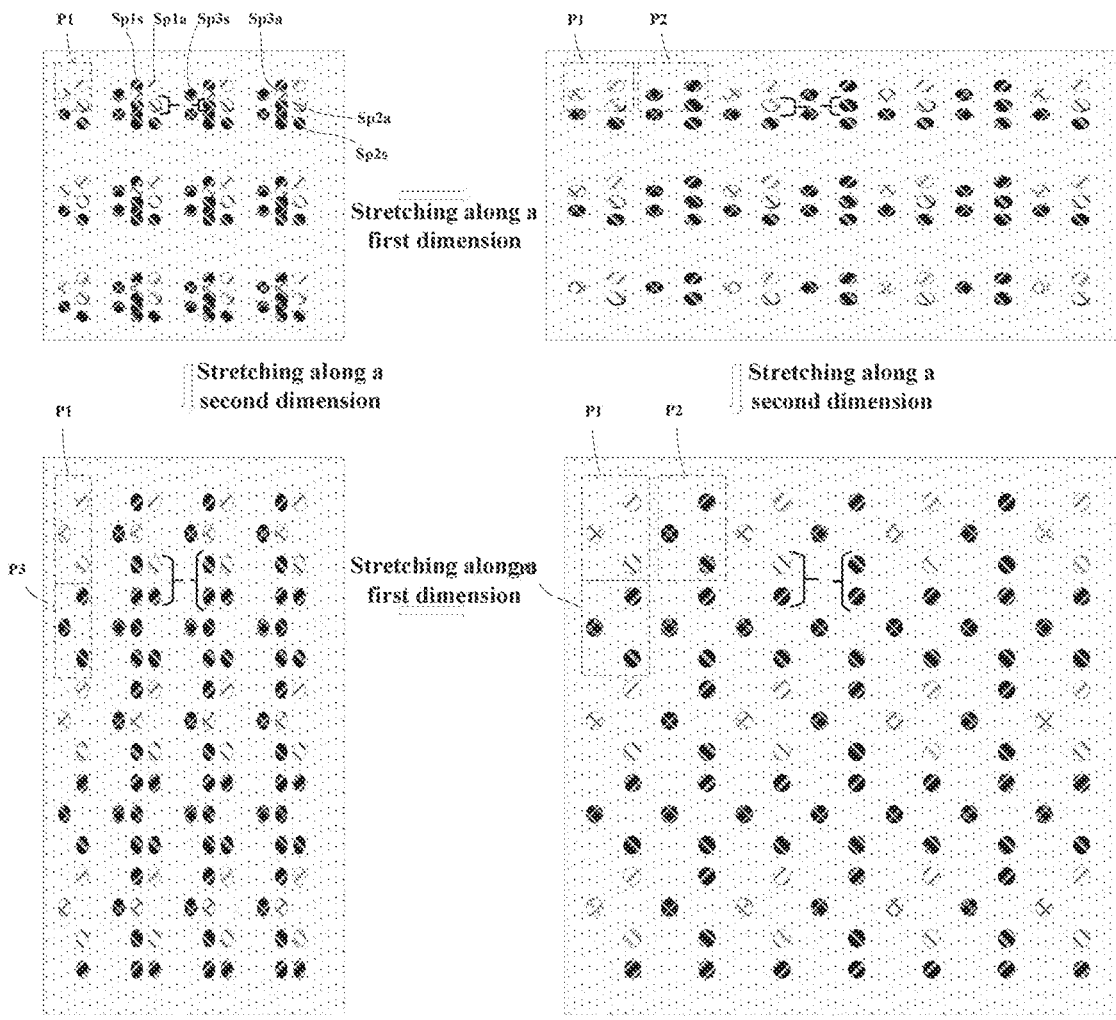
FIG. 14 illustrates a transition of a stretchable display apparatus from a substantially non-stretched state to a stretched state in some embodiments according to the present disclosure.

Optionally, the stretchable display apparatus is substantially stretched in the stretched state; in the stretched state, the plurality of first standby subpixels of the first color Sp1s, the plurality of second standby subpixels of the second color Sp2s, and the plurality of third standby subpixels of the third color Sp3s are all configured to emit light for image display; and an image display resolution in the substantially non-stretched state is substantially the same as an image display resolution in the stretched state. FIG. 14 illustrates a transition of a stretchable display apparatus from a substantially non-stretched state to a stretched state in some embodiments according to the present disclosure. Referring to FIG. 14, the stretchable display apparatus may be independently stretched along a first dimension (e.g., a x-direction) and along a second dimension (e.g., a y-direction). Referring to FIG. 11A, in the substantially non-stretched state, only the plurality of first active subpixels of the first color Sp1a, the plurality of second active subpixels of the second color Sp2a, and the plurality of third active subpixels of the third color Sp3a are configured to emit light for image display. A respective one of the plurality of first active subpixels of the first color Sp1a, a respective one of the plurality of second active subpixels of the second color Sp2a, and a respective one of the plurality of third active subpixels of the third color Sp3a constitute a first pixel P1. Referring to FIG. 14, when the stretchable display apparatus is stretched along the first dimension, a length of the stretchable display apparatus increases (e.g., doubles). In this state, at least a portion of the plurality of first standby subpixels of the first color Sp1s, at least a portion of the plurality of second standby subpixels of the second color Sp2s, and at least a portion of the plurality of third standby subpixels of the third color Sp3s are configured to emit light for image display. A respective one of the plurality of first standby subpixels of the first color Sp1s, a respective one of the plurality of second standby subpixels of the second color Sp2s, and a respective one of the plurality of third standby subpixels of the third color Sp3s constitute a second pixel P2. When the stretchable display apparatus is stretched along the second dimension, a width of the stretchable display apparatus increase (e.g., doubles). In this state, at least a portion of the plurality of first standby subpixels of the first color Sp1s, at least a portion of the plurality of second standby subpixels of the second color Sp2s, and at least a portion of the plurality of third standby subpixels of the third color Sp3s are configured to emit light for image display. A respective one of the plurality of first standby subpixels of the first color Sp1s, a respective one of the plurality of second standby subpixels of the second color Sp2s, and a respective one of the plurality of third standby subpixels of the third color Sp3s constitute a third pixel P3.

When the stretchable display apparatus is stretched along the first dimension and stretched along the second dimension, the stretchable display apparatus is substantially stretched (e.g., in a fully stretched state). In this state, a length of the stretchable display apparatus increases (e.g., doubles) and a width of the stretchable display apparatus increases (e.g., doubles). In the fully stretched state, the plurality of first standby subpixels of the first color Sp1s, the plurality of second standby subpixels of the second color Sp2s, and the plurality of third standby subpixels of the third color Sp3s are all configured to emit light for image display. A respective one of the plurality of first standby subpixels of the first color Sp1s, a respective one of the plurality of second standby subpixels of the second color Sp2s, and a respective one of the plurality of third standby subpixels of the third color Sp3s constitute a second pixel P2. A respective one of the plurality of first standby subpixels of the first color Sp1s, a respective one of the plurality of second standby subpixels of the second color Sp2s, and a respective one of the plurality of third standby subpixels of the third color Sp3s constitute a third pixel P3. The image display resolution in the substantially non-stretched state is substantially the same as an image display resolution in the stretched state. As used herein, the term "image display resolution" refers to the resolution of displayed image. Optionally, the image display resolution may be represented by pixels-per-unit area, e.g., pixels-per-inch (PPI).

In some embodiments, the second stretchable display panel DP2 and the third stretchable display panel DP3 are at least partially transparent display panels allowing at least a portion of light emitted from the first stretchable display panel DP1 to transmit through. Optionally, the third stretchable display panel DP3 is an at least partially transparent display panel allowing at least a portion of light emitted from the first stretchable display panel DP1 and at least a portion of light emitted from the second stretchable display panel DP2 to transmit through. In some embodiments, the first stretchable display panel DP1 comprises a stretchable base substrate (see, e.g., BS1 in FIG. 13A).

Referring to FIG. 14, in the substantially non-stretched state, orthographic projections of at least a portion of the plurality of first subpixels of the first color on the stretchable base substrate are at least partially overlapping with one or a combination of (1) orthographic projections of the plurality of second subpixels of the second color on the stretchable base substrate, and (2) orthographic projections of the plurality of third subpixels of the third color on the stretchable base substrate. Optionally, the orthographic projections of at least a portion of the plurality of first subpixels of the first color on the stretchable base substrate are at least partially overlapping with the orthographic projections of the plurality of second subpixels of the second color on the stretchable base substrate, and at least partially overlapping with the orthographic projections of the plurality of third subpixels of the third color on the stretchable base substrate.

In some embodiments, and referring to FIG. 14, in the substantially non-stretched state, orthographic projections of the plurality of second active subpixels of the second color Sp2*a* on the stretchable base substrate are substantially non-overlapping with the orthographic projections of the plurality of third subpixels of the third color on the stretchable base substrate. Optionally, orthographic projections of the plurality of first active subpixels of the first color Sp1*a* on the stretchable base substrate are substantially non-overlapping with the orthographic projections of the plurality of second subpixels of the second color on the stretchable base substrate, and are substantially non-overlapping with the orthographic projections of the plurality of third subpixels of the third color on the stretchable base substrate.

In some embodiments, and referring to FIG. 14, in the substantially non-stretched state, orthographic projections of at least a portion of the plurality of second standby subpixels of the second color Sp2*s* on the stretchable base substrate are at least partially overlapping with the orthographic projections of the plurality of third subpixels of the third color on the stretchable base substrate. Optionally, in the substantially non-stretched state, orthographic projections of at least a portion of the plurality of first standby subpixels of the first color Sp1*s* on the stretchable base substrate are at least partially overlapping with one or a combination of (1) the orthographic projections of the plurality of second subpixels of the second color on the stretchable base substrate, and (2) the orthographic projections of the plurality of third subpixels of the third color on the stretchable base substrate. Optionally, in the substantially non-stretched state, orthographic projections of at least a portion of the plurality of first standby subpixels of the first color Sp1*s* on the stretchable base substrate are at least partially overlapping with the orthographic projections of the plurality of second subpixels of the second color on the stretchable base substrate; and at least partially overlapping with the orthographic projections of the plurality of third subpixels of the third color on the stretchable base substrate.

In some embodiments, in the substantially non-stretched state (left upper corner), orthographic projections of at least a portion of the plurality of first standby subpixels of the first color Sp1*s* on the stretchable base substrate are substantially overlapping with the orthographic projections of the plurality of second subpixels of the second color on the stretchable base substrate, for example, the orthographic projections of at least a portion of the plurality of first standby subpixels of the first color Sp1*s* on the stretchable base substrate are substantially overlapping with the orthographic projections of the plurality of second active subpixels of the second color Sp2*a* on the stretchable base substrate (explained in detail below). In the substantially stretched state (right bottom corner), the at least a portion of the plurality of first standby subpixels of the first color Sp1*s* become uncovered, for example, the orthographic projections of at least a portion of the plurality of first standby subpixels of the first color Sp1*s* on the stretchable base substrate become only partially overlapping or non-overlapping with the orthographic projections of the plurality of second active subpixels of the second color Sp2*a* on the stretchable base substrate (explained in detail below).

For example, a pair of one of the plurality of first standby subpixels of the first color Sp1*s* and one of the plurality of second active subpixels of the second color Sp2*a* are denoted using a right bracket in FIG. 14. In the substantially non-stretched state (left upper corner), orthographic projections of the pair on the stretchable base substrate are substantially overlapping with each other (optionally, completely overlapping with each other), for example, the one of the plurality of first standby subpixels of the first color Sp1*s* is substantially covered by the one of the plurality of second active subpixels of the second color Sp2*a* in the substantially non-stretched state. In the substantially stretched state (right bottom corner), the one of the plurality of first standby subpixels of the first color Sp1*s* becomes uncovered, and orthographic projections of the pair on the stretchable base substrate are substantially non-overlapping with each other (optionally, completely non-overlapping with each other).

In another example, similarly, a pair of one of the plurality of first standby subpixels of the first color Sp1*s* and one of the plurality of second standby subpixels of the second color Sp2*s* are denoted using a left bracket in FIG. 14. In the substantially non-stretched state (left upper corner), orthographic projections of the pair on the stretchable base substrate are substantially overlapping with each other (optionally, completely overlapping with each other), for example, the one of the plurality of first standby subpixels of the first color Sp1*s* is substantially covered by the one of the plurality of second standby subpixels of the second color Sp2*s* in the substantially non-stretched state. In the substantially stretched state (right bottom corner), the one of the plurality of first standby subpixels of the first color Sp1*s* becomes uncovered, and orthographic projections of the pair on the stretchable base substrate are substantially non-overlapping with each other (optionally, completely non-overlapping with each other).

Figure 15:
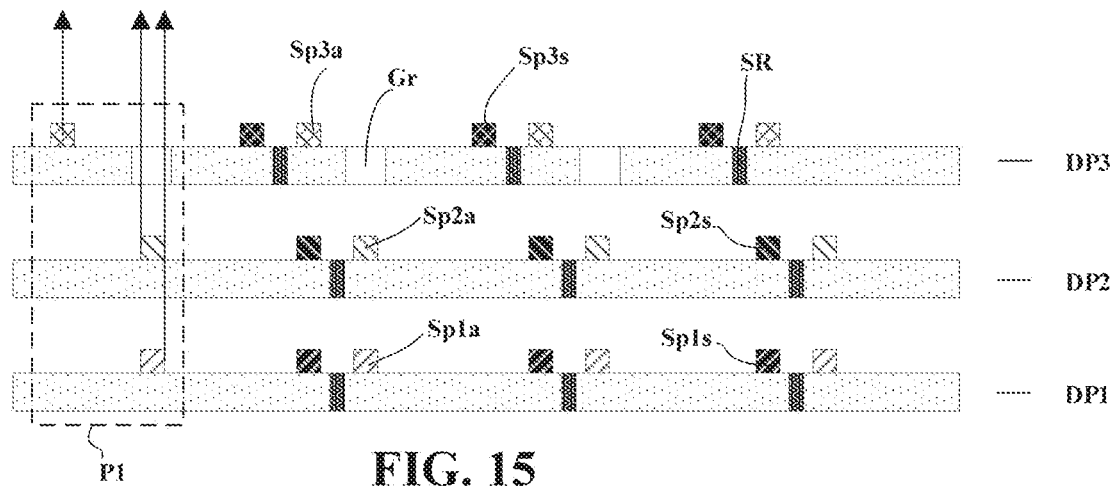
FIG. 15 is a cross-sectional view along a C-C line of a stretchable display apparatus in FIG. 11A in some embodiments according to the present disclosure.
Figure 16:
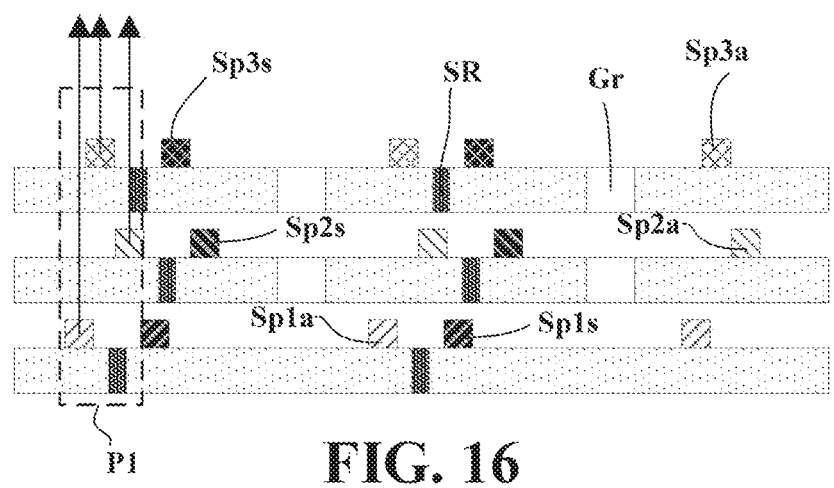
FIG. 16 is a cross-sectional view along a D-D' line of a stretchable display apparatus in FIG. 11A in some embodiments according to the present disclosure.

FIG. 15 is a cross-sectional view along a C-C' line of a stretchable display apparatus in FIG. 11A in some embodiments according to the present disclosure. FIG. 16 is a cross-sectional view along a D-D' line of a stretchable display apparatus in FIG. 11A in some embodiments according to the present disclosure. Referring to FIG. 15 and FIG. 16, in some embodiments, the first stretchable display panel DP1, the second stretchable display panel DP2, and the third stretchable display panel DP3 are stacked on top of each other. Optionally, the stretchable display apparatus includes a plurality of stretchable regions SR. In one example, a respective one of the plurality of stretchable regions SR is between adjacent subpixels in a same display panel. In another example, the respective one of the plurality of stretchable regions SR is between a respective one of the plurality of first standby subpixels of the first color Sp1*s* and a respective one of the plurality of first active subpixels of the first color Sp1*a* adjacent to each other. In another example, the respective one of the plurality of stretchable regions SR is between adjacent first standby subpixels of the first color of the plurality of first standby subpixels of the first color Sp1*s*. In another example, the respective one of the plurality of stretchable regions SR is between a respective one of the plurality of second standby subpixels of the second color Sp2*s* and a respective one of the plurality of second active subpixels of the second color Sp2*a* adjacent to each other. In another example, the respective one of the plurality of stretchable regions SR is between adjacent second standby subpixels of the second color of the plurality of second standby subpixels of the second color Sp2s. In another example, the respective one of the plurality of stretchable regions SR is between a respective one of the plurality of third standby subpixels of the third color Sp3s and a respective one of the plurality of third active subpixels of the third color Sp3a adjacent to each other. In another example, the respective one of the plurality of stretchable regions SR is between adjacent third standby subpixels of the third color of the plurality of third standby subpixels of the third color Sp3s.

Referring to FIG. 15 and FIG. 16, in some embodiments, the second stretchable display panel DP2 and/or the third stretchable display panel DP3 have a plurality of gap regions Gr that enhance light transmittance of light emitted from a lower level display panel. For example, gaps regions of the plurality of gap regions Gr in the second stretchable display panel DP2 enhance light transmittance of light emitted from the first stretchable display panel DP1. In another example, gap regions of the plurality of gap regions Gr in the third stretchable display panel DP3 enhance light transmittance of light emitted from the second stretchable display panel DP2 as well as light emitted from the first stretchable display panel DP1.

Figure 17:
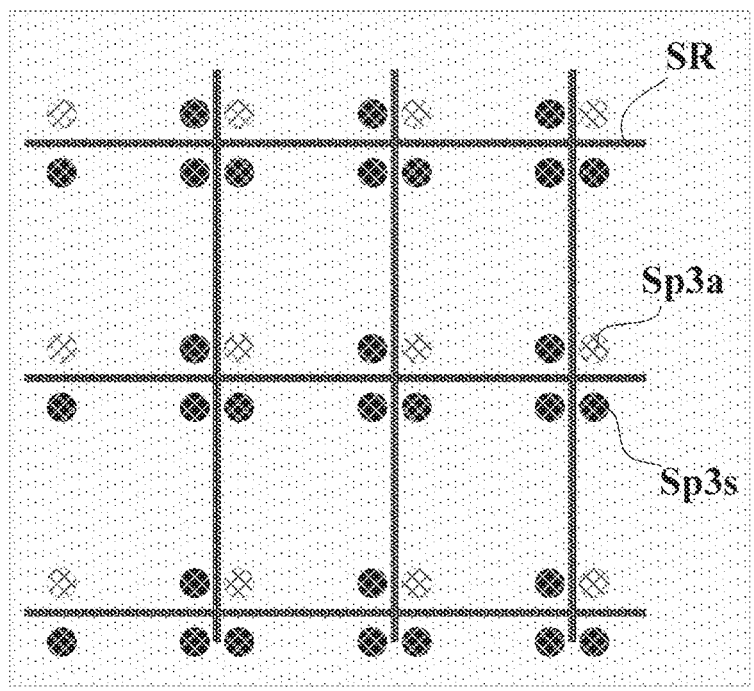
FIG. 17 illustrates a stretchable region in a stretchable display apparatus in some embodiments according to the present disclosure.

FIG. 17 illustrates a stretchable region in a stretchable display apparatus in some embodiments according to the present disclosure. Referring to FIG. 17, in some embodiments, subpixels in a group of three standby subpixels and one active subpixel (e.g., three third standby subpixels of the plurality of third standby subpixels of the third color Sp3s and one third active subpixel of the plurality of third active subpixels of the third color Sp3a as shown in FIG. 17) are spaced apart from each other by one or more stretchable regions of the plurality of stretchable regions SR. The plurality of stretchable regions SR form a plurality of rows and a plurality of columns of stretchable regions in the stretchable display apparatus.

Figure 18:
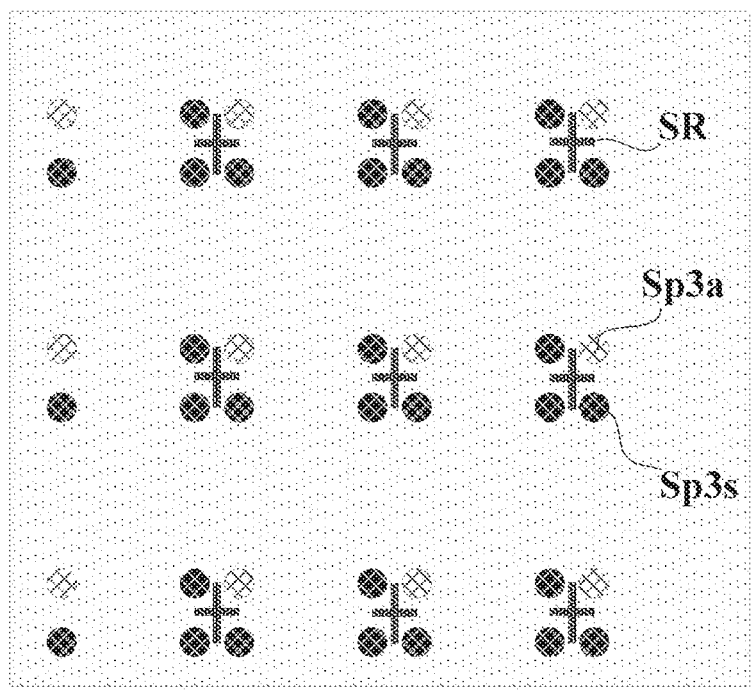
FIG. 18 illustrates a stretchable region a stretchable display apparatus in some embodiments according to the present disclosure.

FIG. 18 illustrates a stretchable region in a stretchable display apparatus in some embodiments according to the present disclosure. Referring to FIG. 18, in some embodiments, the plurality of stretchable regions SR are a plurality of stretchable regions having a cross-shape cross-section. A respective one of the plurality of stretchable regions having the cross-shape cross-section spaces apart subpixels in a group of three standby subpixels and one active subpixel (e.g., three third standby subpixels of the plurality of third standby subpixels of the third color Sp3s and one third active subpixel of the plurality of third active subpixels of the third color Sp3a as shown in FIG. 18) from each other.

Referring to FIGS. 1 to 18, in some embodiments, a total number of the plurality of first active subpixels of the first color Sp1a, a total number of the plurality of second active subpixels of the second color Sp2a, and a total number of the plurality of third active subpixels of the third color Sp3a are substantially the same. Optionally, a total number of the plurality of first standby subpixels of the first color Sp1s, a total number of the plurality of second standby subpixels of the second color Sp2s, and a total number of the plurality of third standby subpixels of the third color Sp3s are substantially the same. Optionally, the total number of the plurality of first standby subpixels of the first color Sp1s is approximately three times of the total number of the plurality of first active subpixels of the first color Sp1a. Optionally, the total number of the plurality of second standby subpixels of the second color Sp2s is approximately three times the total number of the plurality of second active subpixels of the second color Sp2a. Optionally, the total number of the plurality of third standby subpixels of the third color Sp3s is approximately three times of the total number of the plurality of third active subpixels of the third color Sp3a.

Referring to FIGS. 1 to 18, in some embodiments, when the stretchable display apparatus is substantially stretched in the stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other.

Figure 19A:
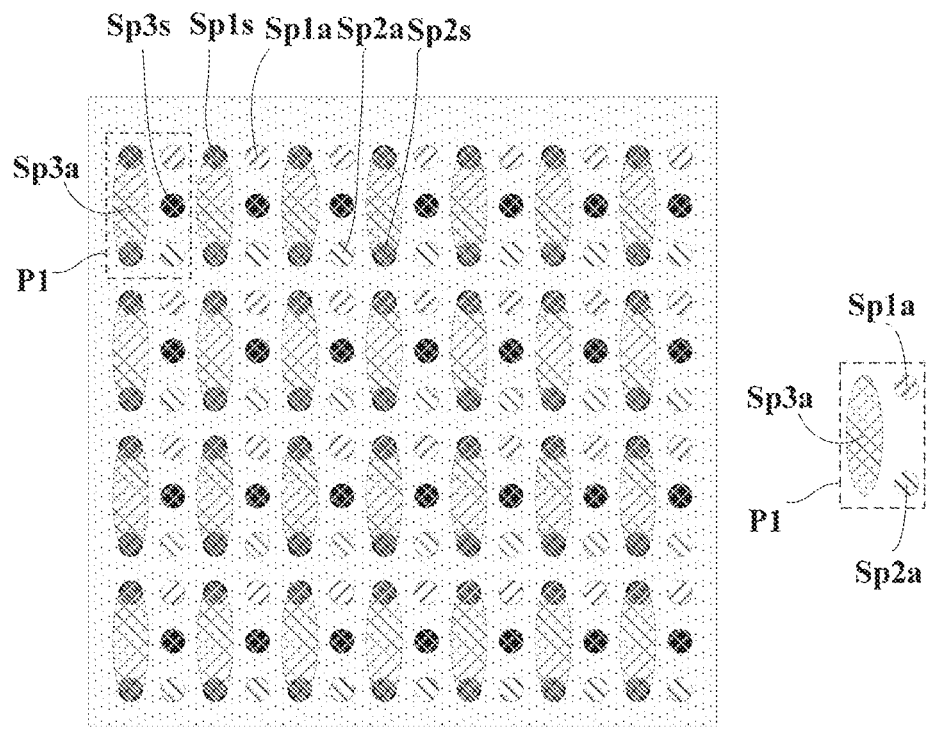
FIG. 19A is a plan view of a stretchable display apparatus in some embodiments according to the present disclosure.
Figure 20:
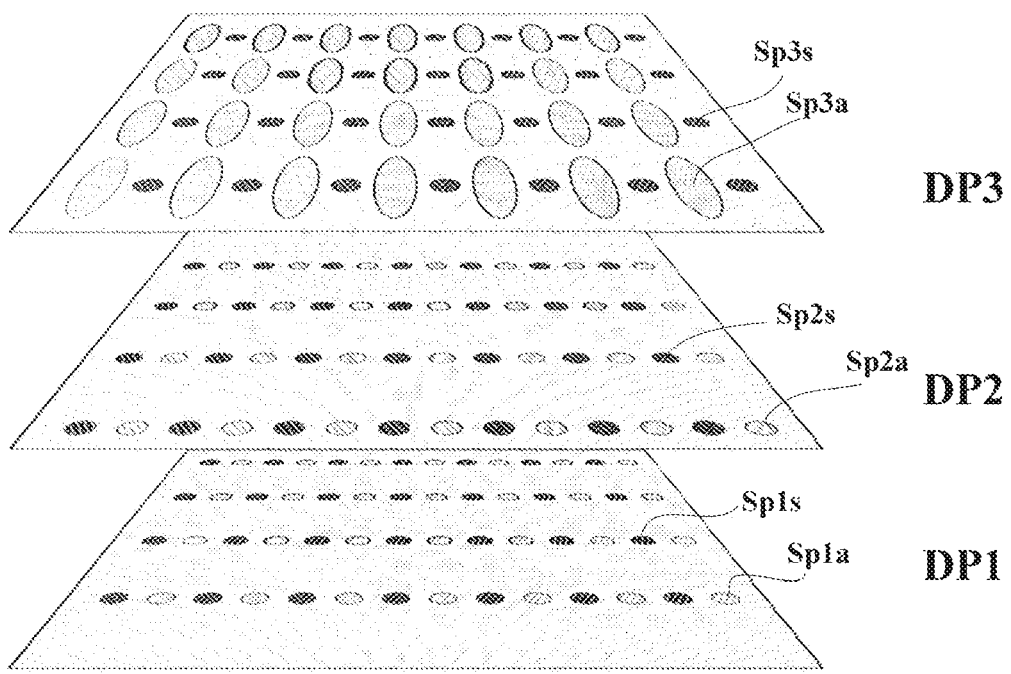
FIG. 20 is a perspective view of a stretchable display apparatus in some embodiments according to the present disclosure.
Figure 21A:
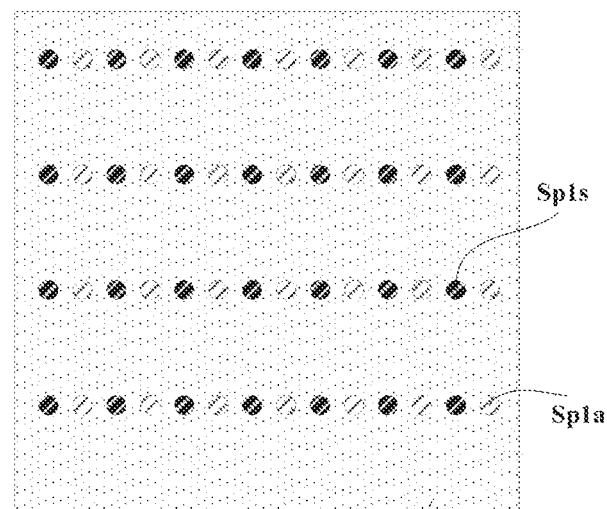
FIGS. 21A to 21C respectively illustrate the structures of a first stretchable display panel, a second stretchable display panel, and a third stretchable display panel of a stretchable display apparatus in some embodiments according to the present disclosure.
Figure 21B:
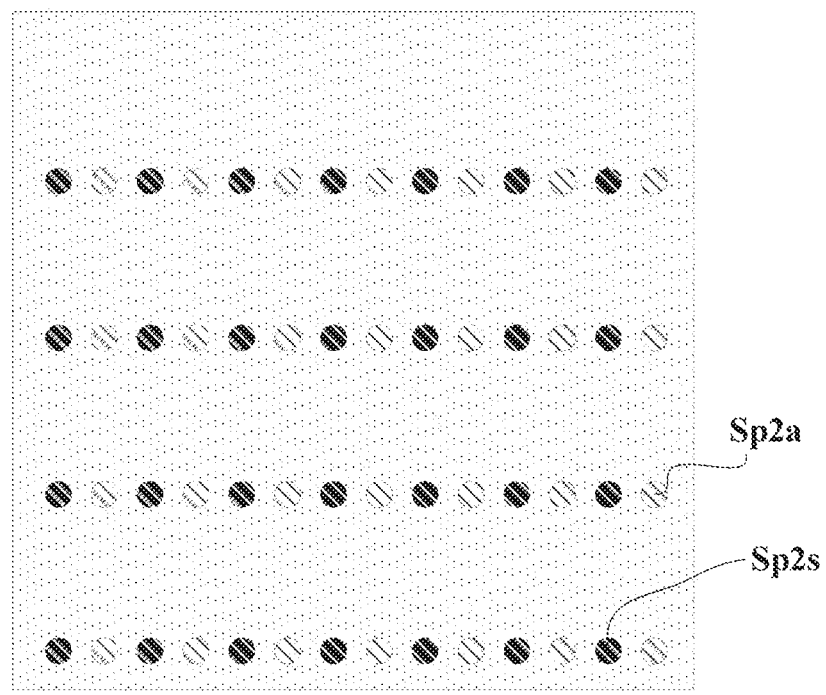
Figure 21C:
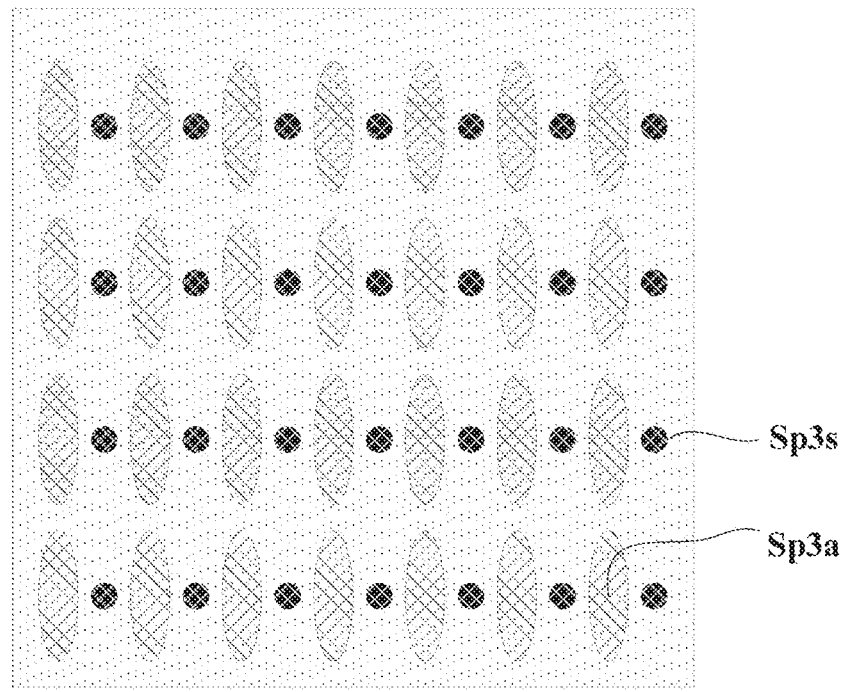

FIG. 19A is a plan view of a stretchable display apparatus in some embodiments according to the present disclosure. FIG. 20 is a perspective view of a stretchable display apparatus in some embodiments according to the present disclosure. FIGS. 21A to 21C respectively illustrate the structures of a first stretchable display panel, a second stretchable display panel, and a third stretchable display panel of a stretchable display apparatus in some embodiments according to the present disclosure. FIGS. 19A, 20, and 21A to 21C show the stretchable display apparatus in a substantially non-stretched state. In some embodiments, the stretchable display apparatus includes a first stretchable display panel DP1 including a first matrix of a plurality of first subpixels of a first color, the first matrix including a first active matrix of a plurality of first active subpixels of the first color Sp1a and a first standby matrix of a plurality of first standby subpixels of the first color Sp1s; a second stretchable display panel DP2 including a second matrix of a plurality of second subpixels of a second color, the second matrix including a second active matrix of a plurality of second active subpixels Sp2a of the second color and a second standby matrix of a plurality of second standby subpixels of the second color Sp2s and a third stretchable display panel DP3 including a third matrix of a plurality of third subpixels of a third color, the third matrix including a third active matrix of a plurality of third active subpixels of the third color Sp3a and a third standby matrix of a plurality of third standby subpixels of the third color Sp3s. The first stretchable display panel DP1, the second stretchable display panel DP2, and the third stretchable display panel DP3 are sequentially stacked on top of each other. Optionally, the first stretchable display panel DP1 is disposed at the bottom of the stretchable display apparatus, the third stretchable display panel DP3 is disposed at the top of the stretchable display apparatus, and the second stretchable display panel DP2 is between the first stretchable display panel DP1 and the third stretchable display panel DP3.

The first active matrix interleaves with the first standby matrix thereby forming the first matrix. The second active matrix interleaves with the second standby matrix thereby forming the second matrix. The third active matrix interleaves with the third standby matrix thereby forming the third matrix.

In some embodiments, in the substantially non-stretched state, the plurality of first active subpixels of the first color Sp1a, the plurality of second active subpixels of the second color Sp2a, and the plurality of third active subpixels of the third color Sp3a are configured to emit light for image display; and the plurality of first standby subpixels of the first color Sp1s, the plurality of second standby subpixels of the second color Sp2s, and the plurality of third standby subpixels of the third color Sp3s are configured to be in a standby state and not emit light.

In some embodiments, in the stretched state, the plurality of first active subpixels of the first color Sp1a, the plurality of second active subpixels of the second color Sp2a, and the plurality of third active subpixels of the third color Sp3a, at least a portion of the plurality of first standby subpixels of the first color Sp1s, at least a portion of the plurality of second standby subpixels of the second color Sp2s, and at least a portion of the plurality of third standby subpixels of the third color Sp3s are configured to emit light for image display.

Optionally, as shown in FIGS. 19A, 20, and 21A to 21C, a respective one of the plurality of third active subpixels of the third color Sp3a occupies an area having a first size; and other subpixels such as a respective one of the plurality of first active subpixels of the first color Sp1a, a respective one of the plurality of first standby subpixels of the first color Sp1s, a respective one of the plurality of second active subpixels of the second color Sp2a, a respective one of the plurality of second standby subpixels of the second color Sp2s, and a respective one of the plurality of third standby subpixels of the third color Sp3s, each occupies an area having a second size. Optionally, the first size is greater than the second size. Optionally, the first size is approximately two times of the second size. Optionally, the first size is greater than two times of the second size.

In some embodiments, and referring to FIGS. 19A, 20, and 21A to 21C, the first standby matrix includes a plurality of rows of first standby subpixels of the first color and a plurality of columns of contiguously arranged first standby subpixels of the first color. Adjacent first standby subpixels of the first color in a row of the first standby matrix are spaced apart by a first active subpixel of the first color of the plurality of first active subpixels of the first color Sp1a. The first active matrix includes a plurality of rows of first active subpixels of the first color and a plurality of columns of contiguously arranged first active subpixels of the first color. Adjacent first active subpixels of the first color in a row of the first active matrix are spaced apart by a first standby subpixel of the first color of the plurality of first standby subpixels of the first color Sp1s. The second standby matrix includes a plurality of rows of second standby subpixels of the second color and a plurality of columns of contiguously arranged second standby subpixels of the second color. Adjacent second standby subpixels of the second color in a row of the second standby matrix are spaced apart by a second active subpixel of the second color of the plurality of second active subpixels of the second color Sp2a. The second active matrix includes a plurality of rows of second active subpixels of the second color and a plurality of columns of contiguously arranged second active subpixels of the second color. Adjacent second active subpixels of the second color in a row of the second active matrix are spaced apart by a second standby subpixel of the second color of the plurality of second standby subpixels of the second color Sp2s. The third standby matrix includes a plurality of rows of third standby subpixels of the third color and a plurality of columns of contiguously arranged third standby subpixels of the third color. Adjacent third standby subpixels of the third color in a row of the third standby matrix are spaced apart by a third active subpixel of the third color of the plurality of third active subpixels of the third color Sp3a. The third active matrix includes a plurality of rows of third active subpixels of the third color and a plurality of columns of contiguously arranged third active subpixels of the third color. Adjacent third active subpixels of the third color in a row of the third active matrix are spaced apart by a third standby subpixel of the third color of the plurality of third standby subpixels of the third color Sp3s.

In some embodiments, and referring to FIGS. 19A, 20, and 21A to 21C, the first stretchable display panel DP1 comprises a stretchable base substrate (see. e.g., BS1 in FIG. 21A). Optionally, in the substantially non-stretched state, an orthographic projection of a respective one of the plurality of third active subpixels of the third color Sp3a on the stretchable base substrate at least partially covers an orthographic projection of a respective one of the plurality of first standby subpixels of the first color Sp1s, and at least partially covers an orthographic projection of a respective one of the plurality of second standby subpixels of the second color Sp2s.

Figure 19B:
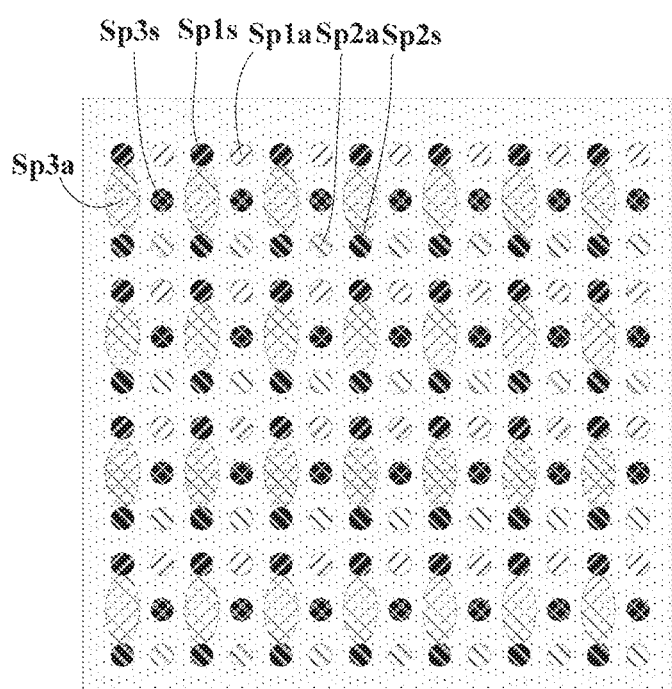
FIG. 19B is a plan view of a stretchable display apparatus in some embodiments according to the present disclosure.

FIG. 19B is a plan view of a stretchable display apparatus in some embodiments according to the present disclosure. Referring to FIG. 19B, in some embodiments, the orthographic projection of a respective one of the plurality of third active subpixels of the third color Sp3a on the stretchable base substrate is substantially non-overlapping with the orthographic projection of a respective one of the plurality of first standby subpixels of the first color Sp1s, and is substantially non-overlapping with the orthographic projection of a respective one of the plurality of second standby subpixels of the second color Sp2s. Optionally, the orthographic projection of the respective one of the plurality of third active subpixels of the third color Sp3a on the stretchable base substrate partially overlaps with the orthographic projection of the respective one of the plurality of first standby subpixels of the first color Sp1s on the stretchable base substrate. Optionally, the orthographic projection of the respective one of the plurality of third active subpixels of the third color Sp3a on the stretchable base substrate partially overlaps with the orthographic projection of the respective one of the plurality of second standby subpixels of the second color Sp2s on the stretchable base substrate. Referring to FIG. 19A and FIG. 19B, in some embodiments, the respective one of the plurality of third active subpixels of the third color Sp3a has a subpixel area greater than a subpixel area of the respective one of the plurality of first standby subpixels of the first color Sp1s, and greater than a subpixel area of the respective one of the plurality of second standby subpixels of the second color Sp2s.

Figure 22:
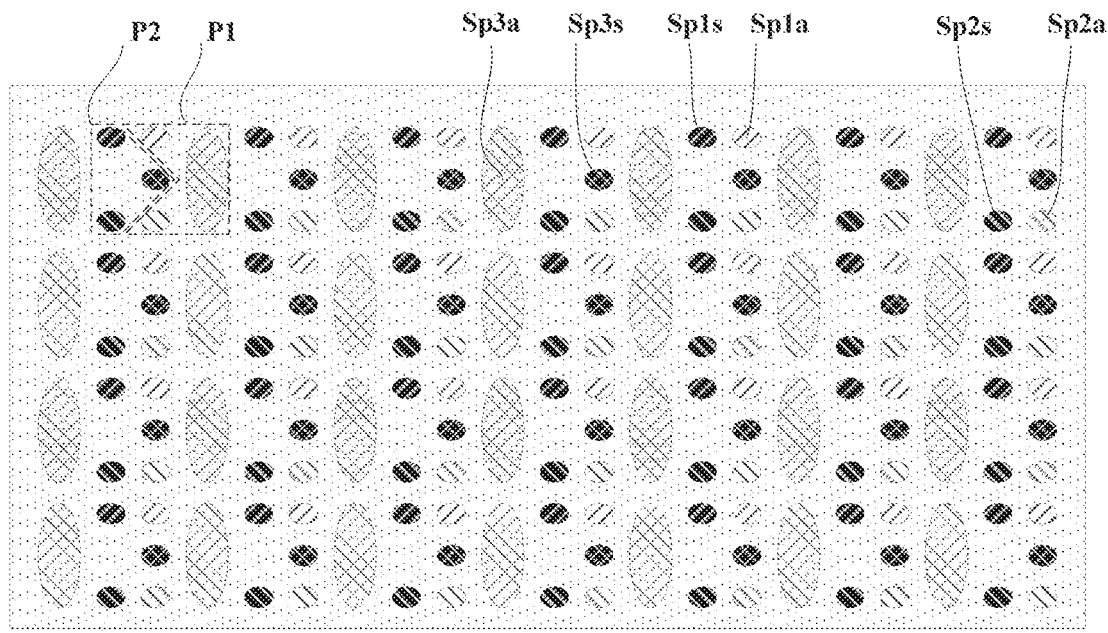
FIG. 22 is a plan view of a stretchable display apparatus in a stretched state in some embodiments according to the present disclosure.

In some embodiments, the stretchable display apparatus is one that stretches along a first dimension (e.g., the x-direction) but not the second dimension (e.g., the y-direction), e.g., a uni-directional stretchable display apparatus. Optionally, the stretchable display apparatus is substantially stretched in the stretched state; in the stretched state, the plurality of first standby subpixels of the first color Sp1s, the plurality of second standby subpixels of the second color Sp2s, and the plurality of third standby subpixels of the third color Sp3s are all configured to emit light for image display; and an image display resolution in the substantially non-stretched state is substantially the same as an image display resolution in the stretched state. FIG. 22 is a plan view of a stretchable display apparatus in a stretched state in some embodiments according to the present disclosure. Referring to FIG. 19A, in the substantially non-stretched state, only the plurality of first active subpixels of the first color Sp1a, the plurality of second active subpixels of the second color Sp2a, and the plurality of third active subpixels of the third color Sp3a are configured to emit light for image display. A respective one of the plurality of first active subpixels of the first color Sp1a, a respective one of the plurality of second active subpixels of the second color Sp2a, and a respective one of the plurality of third active subpixels of the third color Sp3a constitute a first pixel P1. Referring to FIG. 22, the stretchable display apparatus is in a fully stretched state, for example, a length of the stretchable display apparatus increases (e.g., doubles) (a uni-directional stretchable display apparatus). In the fully stretched state, the plurality of first standby subpixels of the first color Sp1s, the plurality of second standby subpixels of the second color Sp2s, and the plurality of third standby subpixels of the third color Sp3s are all configured to emit light for image display. A respective one of the plurality of first standby subpixels of the first color Sp1s, a respective one of the plurality of second standby subpixels of the second color Sp2s, and a respective one of the plurality of third standby subpixels of the third color Sp3s constitute a second pixel P2. The image display resolution in the substantially non-stretched state is substantially the same as an image display resolution in the stretched state.

In the stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other. For example, the plurality of first standby subpixels of the first color Sp1s and the plurality of second standby subpixels of the second color Sp2s become uncovered and configured to emit light.

Referring to FIGS. 19 to 22, in some embodiments, a total number of the plurality of first active subpixels of the first color Sp1a, a total number of the plurality of second active subpixels of the second color Sp2a, and a total number of the plurality of third active subpixels of the third color Sp3a are substantially the same. Optionally, a total number of the plurality of first standby subpixels of the first color Sp1s, a total number of the plurality of second standby subpixels of the second color Sp2s, and a total number of the plurality of third standby subpixels of the third color Sp3s are substantially the same. Optionally, the total number of the plurality of first standby subpixels of the first color Sp1s is substantially the same as the total number of the plurality of first active subpixels of the first color Sp1a. Optionally, the total number of the plurality of second standby subpixels of the second color Sp2s is substantially the same as the total number of the plurality of second active subpixels of the second color Sp2a. Optionally, the total number of the plurality of third standby subpixels of the third color Sp3s is substantially the same as the total number of the plurality of third active subpixels of the third color Sp3a.

In some embodiments, the stretchable display apparatus includes additional columns (e.g., one more or two more) of standby subpixels so that a total number of the active subpixels is not the same as a total number of standby subpixels. Optionally, a total number of standby subpixels is approximately twice of a total number of the active subpixels. In one example, a total number of the plurality of first standby subpixels of the first color is approximately twice of a total number of the plurality of first active subpixels of the first color; a total number of the plurality of second standby subpixels of the second color is approximately twice of a total number of the plurality of second active subpixels of the second color; and a total number of the plurality of third standby subpixels of the third color is approximately twice of a total number of the plurality of third active subpixels of the third color. Optionally, the total number of standby subpixels is approximately three times of the total number of the active subpixels. In another example, the total number of the plurality of first standby subpixels of the first color is approximately three times of the total number of the plurality of first active subpixels of the first color; the total number of the plurality of second standby subpixels of the second color is approximately three times of the total number of the plurality of second active subpixels of the second color; and the total number of the plurality of third standby subpixels of the third color is approximately three times of the total number of the plurality of third active subpixels of the third color.

In some embodiments, the stretchable display apparatus includes one or more additional stretchable display panels, e.g., a fourth stretchable display panel stacked together with the first stretchable display panel DP1, the second stretchable display panel DP2, and the third stretchable display panel DP3. In one example, the fourth stretchable display panel includes a fourth matrix of a plurality of fourth subpixels of a fourth color, the fourth matrix including a fourth active matrix of a plurality of fourth active subpixels of the fourth color and a fourth standby matrix of a plurality of fourth standby subpixels of the fourth color, the fourth active matrix interleaving with the fourth standby matrix thereby forming the fourth matrix. Optionally, in the substantially non-stretched state, the plurality of first active subpixels of the first color, the plurality of second active subpixels of the second color, the plurality of third active subpixels of the third color, and the plurality of fourth active subpixels of the fourth color are configured to emit light for image display; and the plurality of first standby subpixels of the first color, the plurality of second standby subpixels of the second color, the plurality of third standby subpixels of the third color, and the plurality of fourth standby subpixels of the fourth color are configured to be in a standby state and not emit light. Optionally, in the stretched state, the plurality of first active subpixels of the first color, the plurality of second active subpixels of the second color, the plurality of third active subpixels of the third color, the plurality of fourth active subpixels of the fourth color, at least a portion of the plurality of first standby subpixels of the first color, at least a portion of the plurality of second standby subpixels of the second color, at least a portion of the plurality of third standby subpixels of the third color, and at least a portion of the plurality of fourth standby subpixels of the fourth color are configured to emit light for image display. Optionally, the stretchable display apparatus is substantially stretched in the stretched state, the plurality of first standby subpixels of the first color, the plurality of second standby subpixels of the second color, the plurality of third standby subpixels of the third color, and the plurality of fourth standby subpixels of the fourth color are all configured to emit light for image display in the stretched state; and an image display resolution in the substantially non-stretched state is substantially the same as an image display resolution in the stretched state. Optionally, the first color, the second color, the third color, and the fourth color are different colors selected from green, red, blue, and white. Optionally, the first color is green, the second color is red, the third color is blue, and the fourth color is white.

Figure 23:
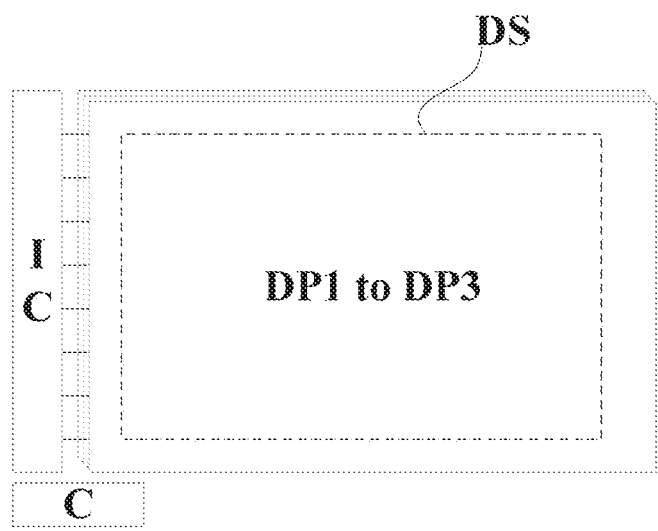
FIG. 23 is a schematic diagram of a stretchable display apparatus in some embodiments according to the present disclosure.

FIG. 23 is a schematic diagram of a stretchable display apparatus in some embodiments according to the present disclosure. Referring to FIG. 23, the stretchable display apparatus in some embodiments includes a first stretchable display panel DP1, a second stretchable display panel DP2, and a third stretchable display panel DP3 stacked on top of each other. In some embodiments, the stretchable display apparatus further includes one or more integrated circuits IC and a controller C coupled to the one or more integrated circuits IC for driving image display of the stretchable display apparatus. Optionally, the controller C is configured to control the plurality of first active subpixels of the first color, the plurality of second active subpixels of the second color, and the plurality of third active subpixels of the third color to emit light for image display in the substantially non-stretched state; and control the plurality of first standby subpixels of the first color, the plurality of second standby subpixels of the second color, and the plurality of third standby subpixels of the third color to be in a standby state and not emit light in the substantially non-stretched state. Optionally, the controller C is configured to control at least a portion of the plurality of first standby subpixels of the first color, at least a portion of the plurality of second standby subpixels of the second color, and at least a portion of the plurality of third standby subpixels of the third color to emit light for image display in the stretched state. Optionally, the stretchable display apparatus is substantially stretched in the stretched state, and the controller C is configured to control the plurality of first standby subpixels of the first color, the plurality of second standby subpixels of the second color, and the plurality of third standby subpixels of the third color are all configured to emit light for image display in the stretched state; and an image display resolution in the substantially non-stretched state is controlled to be substantially the same as an image display resolution in the stretched state.

Referring to FIG. 3, in some embodiments, the stretchable display apparatus further includes a deformation sensor DS configured to detect a degree of the stretchable display apparatus being stretched. The controller C is configured to determine a state of the stretchable display apparatus based on the degree of the stretchable display apparatus being stretched. Optionally, the deformation sensor DS is a stretch sensor, for example, the stretch sensor can be attached to a back side of the stretchable display apparatus. In another example, the stretch sensor can be integrated into the stretchable display apparatus, for example, including a conductive material which undergoes a change in resistance when being stretched. The controller C is configured to determine a state of the stretchable display apparatus based on the change of resistance. Based on the state of the stretchable display apparatus, the controller C and the one or more integrated circuits IC are configured to drive image display of the stretchable display apparatus, for example, determine which subpixels to emit light in the determined state, as discussed above. In one example, when the deformation sensor DS detects that the stretchable display apparatus is fully stretched, the stretchable display apparatus are configured to display an image in all of subpixels, including standby subpixel and active subpixel. In another example, when the deformation sensor DS detects that the stretchable display apparatus is partially stretched, the stretchable display apparatus are configured to display an image in all of the active subpixels and at least portion of the standby subpixels.

Depending on the design and material of the stretchable display apparatus, the stretchable display apparatus may undergo any appropriate stretch transitions. In one example, the stretchable display apparatus may be substantially uniformly and evenly stretched, e.g., throughout the stretchable display apparatus. In another example, the stretchable display apparatus undergoes a step-wise stretch transition, for example, the stretchable regions may be limited to regions between certain subpixels.

In another aspect, the present disclosure provides an image display driving method. In some embodiments, the image display driving method includes providing a stretchable display apparatus having a substantially non-stretched state and a stretched state as described herein; determining a degree of the stretchable display apparatus being stretched thereby determining whether the stretchable display apparatus is in the substantially non-stretched state or in a stretched state; controlling the plurality of first active subpixels of the first color, the plurality of second active subpixels of the second color, and the plurality of third active subpixels of the third color to emit light for image display in the substantially non-stretched state; and controlling the plurality of first standby subpixels of the first color, the plurality of second standby subpixels of the second color, and the plurality of third standby subpixels of the third color to be in a standby state and not emit light in the substantially non-stretched state.

Optionally, the image display driving method further includes controlling the plurality of first active subpixels of the first color, the plurality of second active subpixels of the second color, the plurality of third active subpixels of the third color, at least a portion of the plurality of first standby subpixels of the first color, at least a portion of the plurality of second standby subpixels of the second color, and at least a portion of the plurality of third standby subpixels of the third color to emit light for image display in the stretched state.

Optionally, the stretchable display apparatus is substantially stretched in the stretched state, and the image display driving method further includes controlling the plurality of first standby subpixels of the first color, the plurality of second standby subpixels of the second color, and the plurality of third standby subpixels of the third color all to emit light for image display in the stretched state, so that an image display resolution in the substantially non-stretched state is substantially the same as an image display resolution in the stretched state.

In another aspect, the present disclosure provides a method of fabricating a stretchable display apparatus. In some embodiments, the method of fabricating the stretchable display apparatus includes sequentially stacking a first stretchable display panel, a second stretchable display panel, and a third stretchable display panel on top of each other. The method further includes forming the first stretchable display panel by forming a first matrix of a plurality of first subpixels of a first color, forming the second stretchable display panel by forming a second matrix of a plurality of second subpixels of a second color, and forming the third stretchable display panel by forming a third matrix of a plurality of third subpixels of a third color. Optionally, forming the first matrix includes forming a first active matrix of a plurality of first active subpixels of the first color and a first standby matrix of a plurality of first standby subpixels of the first color, the first active matrix interleaving with the first standby matrix thereby forming the first matrix. Optionally, forming the second matrix includes forming a second active matrix of a plurality of second active subpixels of the second color and a second standby matrix of a plurality of second standby subpixels of the second color, the second active matrix interleaving with the second standby matrix thereby forming the second matrix. Optionally, forming the third matrix includes forming a third active matrix of a plurality of third active subpixels of the third color and a third standby matrix of a plurality of third standby subpixels of the third color, the third active matrix interleaving with the third standby matrix thereby forming the third matrix. The stretchable display apparatus is formed so that, in the substantially non-stretched state, the plurality of first active subpixels of the first color, the plurality of second active subpixels of the second color, and the plurality of third active subpixels of the third color are configured to emit light for image display and the plurality of first standby subpixels of the first color, the plurality of second standby subpixels of the second color, and the plurality of third standby subpixels of the third color are configured to be in a standby state and not emit light.

In some embodiments, each of the stretchable display panels is formed to include a plurality of encapsulated islands and a plurality of bridges connecting the plurality of encapsulated islands. The stretchable display panel is formed to further include an encapsulating structure extending throughout the plurality of bridges and the plurality of encapsulated islands. The stretchable display panel is formed so that a respective one of the plurality of encapsulated islands includes at least one of a plurality of light emitting elements encapsulated therein on a base substrate.

In some embodiments, the stretchable display panel is formed to further include a barrier spacer layer forming a wall surrounding the at least one of a plurality of light emitting elements in the respective one of the plurality of encapsulated islands. The barrier spacer layer may be formed using any appropriate insulating materials, for example, a negative photoresist material or an acrylate resin. The barrier spacer layer is formed to separate a cathode layer from organic materials of the organic functional layer (e.g., an organic light emitting layer). Moreover, the barrier spacer layer functions as a barrier in the process of forming the encapsulating layer, achieving individual encapsulation of the at least one of a plurality of light emitting elements in the respective one of the plurality of encapsulated islands.

In some embodiments, the stretchable display panel is formed to have a plurality of gaps between adjacent encapsulated islands of the plurality of encapsulated islands and adjacent bridges of the plurality of bridges. Each stretchable display panel is formed to include a stretchable base substrate. Optionally, the stretchable display panel is formed to further include an elastic material in a respective one of the plurality of gaps. Optionally, the elastic material is a substantially transparent material that can be stretched along with the stretchable base substrate. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough. Optionally, for the stretchable display panel to be disposed at the bottom of the stretchable display apparatus (e.g., the first stretchable display panel), the elastic material in the respective one of the plurality of gaps can be an opaque material.

In some embodiments, the step of sequentially stacking a first stretchable display panel, a second stretchable display panel, and a third stretchable display panel on top of each other includes adhering adjacent two stretchable display panels using an optically clear adhesive. Optionally, the optically clear adhesive may be formed as an integral layer extending throughout an entire surface of the stretchable display panels. Optionally, the method includes forming a plurality of via holes extending through a respective one of the stretchable display panels; filling the plurality of via holes with the optically clear adhesive; and adhering adjacent two stretchable display panels together using the optically clear adhesive in the plurality of via holes.

In some embodiments, the method further includes attaching one or more chip-on-films on a respective one of the stretchable display panels. Optionally, each of the stretchable display panels is provided with an individual chip-on-film, and all of the chip-on-films are connected to a flexible printed circuit. Optionally, particular when the stretchable display panels are formed by folding an integral panel, a single chip-on-film may be provided to the integral panel, and configured to connected to all of the stretchable display panels.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display apparatus having a substantially non-stretched state and a stretched state, comprising:
a first stretchable display panel comprising a first matrix of a plurality of first subpixels of a first color, the first matrix comprising a first active matrix of a plurality of first active subpixels of the first color and a first standby matrix of a plurality of first standby subpixels of the first color, the first active matrix interleaving with the first standby matrix thereby forming the first matrix;
a second stretchable display panel comprising a second matrix of a plurality of second subpixels of a second color, the second matrix comprising a second active matrix of a plurality of second active subpixels of the second color and a second standby matrix of a plurality of second standby subpixels of the second color, the second active matrix interleaving with the second standby matrix thereby forming the second matrix; and
a third stretchable display panel comprising a third matrix of a plurality of third subpixels of a third color, the third matrix comprising a third active matrix of a plurality of third active subpixels of the third color and a third standby matrix of a plurality of third standby subpixels of the third color, the third active matrix interleaving with the third standby matrix thereby forming the third matrix;

wherein the first stretchable display panel, the second stretchable display panel and the third stretchable display panel are sequentially stacked on top of each other;

wherein, in the substantially non-stretched state, the plurality of first active subpixels of the first color, the plurality of second active subpixels of the second color, and the plurality of third active subpixels of the third color are configured to emit light for image display; and the plurality of first standby subpixels of the first color, the plurality of second standby subpixels of the second color, and the plurality of third standby subpixels of the third color are configured to be in a standby state and not emit light.

2. The stretchable display apparatus of claim 1, wherein, in the stretched state, the plurality of first active subpixels of the first color, the plurality of second active subpixels of the second color, the plurality of third active subpixels of the third color, at least a portion of the plurality of first standby subpixels of the first color, at least a portion of the plurality of second standby subpixels of the second color, and at least a portion of the plurality of third standby subpixels of the third color are configured to emit light for image display.

3. The stretchable display apparatus of claim 2, wherein the stretchable display apparatus is substantially stretched in the stretched state;

in the stretched state, the plurality of first standby subpixels of the first color, the plurality of second standby subpixels of the second color, and the plurality of third standby subpixels of the third color are all configured to emit light for image display; and an image display resolution in the substantially non-stretched state is substantially the same as an image display resolution in the stretched state.

4. The stretchable display apparatus of claim 1, wherein the first standby matrix comprises a plurality of rows of contiguously arranged first standby subpixels of the first color and a plurality of columns of contiguously arranged first standby subpixels of the first color;

adjacent first active subpixels of the first color in a row of the first active matrix are spaced apart by a first standby subpixel of the first color of the plurality of first standby subpixels of the first color;

adjacent first active subpixels of the first color in a column of the first active matrix are spaced apart by a first standby subpixel of the first color of the plurality of first standby subpixels of the first color;

the second standby matrix comprises a plurality of rows of contiguously arranged second standby subpixels of the second color and a plurality of columns of contiguously arranged second standby subpixels of the second color;

adjacent second active subpixels of the second color in a row of the second active matrix are spaced apart by a second standby subpixel of the second color of the plurality of second standby subpixels of the second color;

adjacent second active subpixels of the second color in a column of the second active matrix are spaced apart by a second standby subpixel of the second color of the plurality of second standby subpixels of the second color;

the third standby matrix comprises a plurality of rows of contiguously arranged third standby subpixels of the third color and a plurality of columns of contiguously arranged third standby subpixels of the third color;

adjacent third active subpixels of the third color in a row of the third active matrix are spaced apart by a third standby subpixel of the third color of the plurality of third standby subpixels of the third color; and adjacent third active subpixels of the third color in a column of the third active matrix are spaced apart by a third standby subpixel of the third color of the plurality of third standby subpixels of the third color.

5. The stretchable display apparatus of claim 1, wherein the first standby matrix comprises a plurality of rows of first standby subpixels of the first color and a plurality of columns of contiguously arranged first standby subpixels of the first color;

adjacent first standby subpixels of the first color in a row of the first standby matrix are spaced apart by a first active subpixel of the first color of the plurality of first active subpixels of the first color;

the first active matrix comprises a plurality of rows of first active subpixels of the first color and a plurality of columns of contiguously arranged first active subpixels of the first color;

adjacent first active subpixels of the first color in a row of the first active matrix are spaced apart by a first standby subpixel of the first color of the plurality of first standby subpixels of the first color;

the second standby matrix comprises a plurality of rows of second standby subpixels of the second color and a plurality of columns of contiguously arranged second standby subpixels of the second color;

adjacent second standby subpixels of the second color in a row of the second standby matrix are spaced apart by a second active subpixel of the second color of the plurality of second active subpixels of the second color;

the second active matrix comprises a plurality of rows of second active subpixels of the second color and a plurality of columns of contiguously arranged second active subpixels of the second color;

adjacent second active subpixels of the second color in a row of the second active matrix are spaced apart by a second standby subpixel of the second color of the plurality of second standby subpixels of the second color;

the third standby matrix comprises a plurality of rows of third standby subpixels of the third color and a plurality of columns of contiguously arranged third standby subpixels of the third color;

adjacent third standby subpixels of the third color in a row of the third standby matrix are spaced apart by a third active subpixel of the third color of the plurality of third active subpixels of the third color;

the third active matrix comprises a plurality of rows of third active subpixels of the third color and a plurality of columns of contiguously arranged third active subpixels of the third color; and adjacent third active subpixels of the third color in a row of the third active matrix are spaced apart by a third standby subpixel of the third color of the plurality of third standby subpixels of the third color.

6. The stretchable display apparatus of claim 1, wherein a total number of the plurality of first active subpixels of the first color, a total number of the plurality of second active subpixels of the second color, and a total number of the plurality of third active subpixels of the third color are substantially the same; and a total number of the plurality of first standby subpixels of the first color, a total number of the plurality of second standby subpixels of the second color, and a total number of the plurality of third standby subpixels of the third color are substantially the same.

7. The stretchable display apparatus of claim 6, wherein the total number of the plurality of first standby subpixels of the first color is approximately three times of the total number of the plurality of first active subpixels of the first color;
the total number of the plurality of second standby subpixels of the second color is approximately three times of the total number of the plurality of second active subpixels of the second color; and
the total number of the plurality of third standby subpixels of the third color is approximately three times of the total number of the plurality of third active subpixels of the third color.

8. The stretchable display apparatus of claim 6, wherein the total number of the plurality of first standby subpixels of the first color is substantially the same as the total number of the plurality of first active subpixels of the first color;
the total number of the plurality of second standby subpixels of the second color is substantially the same as the total number of the plurality of second active subpixels of the second color; and
the total number of the plurality of third standby subpixels of the third color is substantially the same as the total number of the plurality of third active subpixels of the third color.

9. The stretchable display apparatus of claim 1, wherein the second stretchable display panel and the third stretchable display panel are at least partially transparent display panels allowing at least a portion of light emitted from the first stretchable display panel to transmit through; and
a light emitting direction of the stretchable display apparatus is substantially along the first stretchable display panel toward the third stretchable display panel.

10. The stretchable display apparatus of claim 9, wherein the first stretchable display panel comprises a stretchable base substrate;
wherein, in the substantially non-stretched state, orthographic projections of at least a portion of the plurality of first subpixels of the first color on the stretchable base substrate are at least partially overlapping with one or a combination of (1) orthographic projections of the plurality of second subpixels of the second color on the stretchable base substrate, and (2) orthographic projections of the plurality of third subpixels of the third color on the stretchable base substrate.

11. The stretchable display apparatus of claim 10, wherein, in the substantially non-stretched state, orthographic projections of the plurality of second active subpixels of the second color on the stretchable base substrate are substantially non-overlapping with the orthographic projections of the plurality of third subpixels of the third color on the stretchable base substrate; and
in the substantially non-stretched state, orthographic projections of the plurality of first active subpixels of the first color on the stretchable base substrate are substantially non-overlapping with the orthographic projections of the plurality of second subpixels of the second color on the stretchable base substrate and are substantially non-overlapping with the orthographic projections of the plurality of third subpixels of the third color on the stretchable base substrate.

12. The stretchable display apparatus of claim 10, wherein, in the substantially non-stretched state, orthographic projections of at least a portion of the plurality of second standby subpixels of the second color on the stretchable base substrate are at least partially overlapping with the orthographic projections of the plurality of third subpixels of the third color on the stretchable base substrate; and
in the substantially non-stretched state, orthographic projections of at least a portion of the plurality of first standby subpixels of the first color on the stretchable base substrate are at least partially overlapping with one or a combination of (1) the orthographic projections of the plurality of second subpixels of the second color on the stretchable base substrate, and (2) the orthographic projections of the plurality of third subpixels of the third color on the stretchable base substrate.

13. The stretchable display apparatus of claim 10, wherein, in the substantially non-stretched state, orthographic projections of at least a portion of the plurality of first standby subpixels of the first color on the stretchable base substrate are substantially overlapping with the orthographic projections of the plurality of second active subpixels of the second color on the stretchable base substrate.

14. The stretchable display apparatus of claim 9, wherein the first stretchable display panel comprises a stretchable base substrate;
wherein, in the substantially non-stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other.

15. The stretchable display apparatus of claim 9, wherein the first stretchable display panel comprises a stretchable base substrate;
wherein, in the substantially non-stretched state, an orthographic projection of a respective one of the plurality of third active subpixels of the third color on the stretchable base substrate at least partially covers an orthographic projection of a respective one of the plurality of first standby subpixels of the first color on the stretchable base substrate, and at least partially covers an orthographic projection of a respective one of the plurality of second standby subpixels of the second color on the stretchable base substrate.

16. The stretchable display apparatus of claim 9, wherein the stretchable display apparatus is substantially stretched in the stretched state;
wherein, in the stretched state, orthographic projections of the plurality of first subpixels of the first color on the stretchable base substrate, orthographic projections of the plurality of second subpixels of the second color on the stretchable base substrate, and orthographic projections of the plurality of third subpixels of the third color on the stretchable base substrate are substantially non-overlapping with each other.

17. The stretchable display apparatus of claim 1, further comprising:
one or more integrated circuits and a controller coupled to the one or more integrated circuits for driving image display of the stretchable display apparatus;
wherein the controller is configured to control the plurality of first active subpixels of the first color, the plurality of second active subpixels of the second color, and the plurality of third active subpixels of the third color to emit light for image display in the substantially non-stretched state; and control the plurality of first standby subpixels of the first color, the plurality of second standby subpixels of the second color, and the plurality of third standby subpixels of the third color to be in a standby state and not emit light in the substantially non-stretched state.

18. The stretchable display apparatus of claim 17, wherein the controller is configured to control at least a portion of the plurality of first standby subpixels of the first color, at least a portion of the plurality of second standby subpixels of the second color, and at least a portion of the plurality of third standby subpixels of the third color to emit light for image display in the stretched state.

19. The stretchable display apparatus of claim 17, further comprising a deformation sensor configured to detect a degree of the stretchable display apparatus being stretched;
   wherein the controller is configured to determine a state of the stretchable display apparatus based on the degree of the stretchable display apparatus being stretched.

20. An image display driving method, comprising:
   providing a stretchable display apparatus having a substantially non-stretched state and a stretched state; and
   determining a degree of the stretchable display apparatus being stretched thereby determining whether the stretchable display apparatus is in the substantially non-stretched state or in a stretched state;
   wherein the stretchable display apparatus comprises:
   a first stretchable display panel comprising a first matrix of a plurality of first subpixels of a first color, the first matrix comprising a first active matrix of a plurality of first active subpixels of the first color and a first standby matrix of a plurality of first standby subpixels of the first color, the first active matrix interleaving with the first standby matrix thereby forming the first matrix;
   a second stretchable display panel comprising a second matrix of a plurality of second subpixels of a second color, the second matrix comprising a second active matrix of a plurality of second active subpixels of the second color and a second standby matrix of a plurality of second standby subpixels of the second color, the second active matrix interleaving with the second standby matrix thereby forming the second matrix; and
   a third stretchable display panel comprising a third matrix of a plurality of third subpixels of a third color, the third matrix comprising a third active matrix of a plurality of third active subpixels of the third color and a third standby matrix of a plurality of third standby subpixels of the third color, the third active matrix interleaving with the third standby matrix thereby forming the third matrix;
   wherein the first stretchable display panel, the second stretchable display panel and the third stretchable display panel are sequentially stacked on top of each other;
   wherein the method further comprises controlling the plurality of first active subpixels of the first color, the plurality of second active subpixels of the second color, and the plurality of third active subpixels of the third color to emit light for image display in the substantially non-stretched state; and
   controlling the plurality of first standby subpixels of the first color, the plurality of second standby subpixels of the second color, and the plurality of third standby subpixels of the third color to be in a standby state and not emit light in the substantially non-stretched state.

* * * * *